United States Patent
Umeda et al.

(10) Patent No.: US 9,806,490 B2
(45) Date of Patent: Oct. 31, 2017

(54) LASER SYSTEM

(71) Applicant: Gigaphoton Inc., Tochigi (JP)

(72) Inventors: Hiroshi Umeda, Oyama (JP); Takeshi Asayama, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/354,670

(22) Filed: Nov. 17, 2016

(65) Prior Publication Data

US 2017/0070023 A1 Mar. 9, 2017

Related U.S. Application Data

(63) Continuation of application No. PCT/JP2014/081659, filed on Nov. 28, 2014.

(30) Foreign Application Priority Data

Jun. 9, 2014 (WO) .................. PCT/JP2014/065242

(51) Int. Cl.
*H01S 3/097* (2006.01)
*H01S 3/23* (2006.01)
(Continued)

(52) U.S. Cl.
CPC .......... *H01S 3/09702* (2013.01); *B23K 26/00* (2013.01); *H01L 21/02686* (2013.01);
(Continued)

(58) Field of Classification Search
CPC ... H01S 3/09702; H01S 3/2383; H01S 3/1305
See application file for complete search history.

(56) References Cited

U.S. PATENT DOCUMENTS 6,865,210 B2 3/2005 Ershov et al.
7,061,959 B2 6/2006 Partlo et al.
(Continued)

FOREIGN PATENT DOCUMENTS

JP 2004-342964 A 12/2004
JP 2005-064184 A 3/2005
(Continued)

OTHER PUBLICATIONS

International Search Report issued in PCT/JP2014/081659; dated Feb. 3, 2015.

*Primary Examiner* — Michael Carter
(74) *Attorney, Agent, or Firm* — Studebaker & Brackett PC

(57) ABSTRACT

The laser system may include a delay circuit unit, first and second trigger-correction units, and a clock generator. The delay circuit unit may receive a trigger signal, output a first delay signal obtained by delaying the trigger signal by a first delay time, and output a second delay signal obtained by delaying the trigger signal by a second delay time. The first trigger-correction unit may receive the first delay signal and output a first switch signal obtained by delaying the first delay signal by a first correction time. The second trigger-correction unit may receive the second delay signal and output a second switch signal obtained by delaying the second delay signal by a second correction time. The clock generator may generate a clock signal that is common to the delay circuit unit and the first and second trigger-correction units.

9 Claims, 25 Drawing Sheets

(51) Int. Cl.
- *H01L 21/02* (2006.01)
- *H01L 21/67* (2006.01)
- *H01S 3/139* (2006.01)
- *B23K 26/00* (2014.01)
- *H01S 3/13* (2006.01)
- *H01S 3/104* (2006.01)
- *H01S 3/225* (2006.01)
- *H01S 3/00* (2006.01)

(52) U.S. Cl.
CPC ...... *H01L 21/67115* (2013.01); *H01S 3/1394* (2013.01); *H01S 3/2383* (2013.01); *H01S 3/0057* (2013.01); *H01S 3/104* (2013.01); *H01S 3/1305* (2013.01); *H01S 3/225* (2013.01); *H01S 3/2308* (2013.01)

(56) References Cited

U.S. PATENT DOCUMENTS

| | | |
|---|---|---|
| 8,238,400 B2 | 8/2012 | Targdorf et al. |
| 8,416,500 B2 | 4/2013 | Mitra et al. |
| 2002/0141470 A1 | 10/2002 | Nakao et al. |
| 2005/0031004 A1 | 2/2005 | Basting et al. |
| 2006/0239309 A1 | 10/2006 | Ariga et al. |
| 2009/0285076 A1 | 11/2009 | Rothenberg |
| 2013/0250263 A1* | 9/2013 | Jain .................... H01S 3/09702 355/67 |

FOREIGN PATENT DOCUMENTS

| | | |
|---|---|---|
| JP | 2009-099727 A | 5/2009 |
| JP | 2012-019250 A | 1/2012 |
| JP | 2013-094845 A | 5/2013 |

* cited by examiner

LASER SYSTEM

TECHNICAL FIELD

The present disclosure relates to a laser system.

BACKGROUND ART

A laser annealing apparatus may apply a pulse laser beam on an amorphous silicon film formed on a substrate. The pulse laser beam may be emitted from a laser system such as an excimer laser system. The pulse laser beam may have a wavelength of ultraviolet light region. Such pulse laser beam may reform the amorphous silicon film to a poly-silicon film. The poly-silicon film can be used to form thin film transistors (TFTs). The TFTs may be used in large-sized liquid crystal displays.

LIST OF DOCUMENTS

Patent Document

Patent Document 1: Japanese Patent Application Publication No. 2004-342964
Patent Document 2: U.S. Pat. No. 8,238,400
Patent Document 3: U.S. Pat. No. 6,865,210

SUMMARY

A laser system according to one aspect of the present disclosure may include: a delay circuit unit configured to receive a trigger signal, output a first delay signal representing that a first delay time has passed since the delay circuit unit received the trigger signal, and output a second delay signal representing that a second delay time has passed since the delay circuit unit received the trigger signal; a first trigger-correction unit configured to receive the first delay signal and output a first switch signal representing that a first correction time has passed since the first trigger-correction unit received the first delay signal; a second trigger-correction unit configured to receive the second delay signal and output a second switch signal representing that a second correction time has passed since the second trigger-correction unit received the second delay signal; a first laser apparatus including a first capacitor, a first charger configured to apply voltage to the first capacitor, a first switch configured to receive the first switch signal and allow the first capacitor to output a pulse current, a first magnetic compression circuit configured to compress the pulse current outputted from the first capacitor, a first chamber containing laser gas, a first pair of discharge electrodes provided in the first chamber and connected to the first magnetic compression circuit, and a first discharge timing detector configured to detect discharge between the first pair of discharge electrodes and output a first discharge detection signal; a second laser apparatus including a second capacitor, a second charger configured to apply voltage to the second capacitor, a second switch configured to receive the second switch signal and allow the second capacitor to output a pulse current, a second magnetic compression circuit configured to compress the pulse current outputted from the second capacitor, a second chamber containing laser gas, a second pair of discharge electrodes provided in the second chamber and connected to the second magnetic compression circuit, and a second discharge timing detector configured to detect discharge between the second pair of discharge electrodes and output a second discharge detection signal; and a clock generator configured to generate a clock signal that is common to the delay circuit unit, the first trigger-correction unit and the second trigger-correction unit. The first trigger-correction unit may receive the first discharge detection signal. The first trigger-correction unit may set the first correction time so that a first elapsed time between a timing of receiving the first delay signal and a timing of receiving the first discharge detection signal approaches a first target value. The second trigger-correction unit may receive the second discharge detection signal. The second trigger-correction unit may set the second correction time so that a second elapsed time between a timing of receiving the second delay signal and a timing of receiving the second discharge detection signal approaches a second target value.

A laser system according to another aspect of the present disclosure may include a first laser apparatus and a second laser apparatus. The first laser apparatus may include: a first delay circuit unit configured to receive a trigger signal and output a first delay signal representing that a first delay time has passed since the first delay circuit unit received the trigger signal, a first trigger-correction unit configured to receive the first delay signal and output a first switch signal representing that a first correction time has passed since the first trigger-correction unit received the first delay signal, a first clock generator configured to generate a clock signal that is common to the first delay circuit unit and the first trigger-correction unit, a first capacitor, a first charger configured to apply voltage to the first capacitor, a first switch configured to receive the first switch signal and allow the first capacitor to output a pulse current, a first magnetic compression circuit configured to compress the pulse current outputted from the first capacitor, a first chamber containing laser gas, a first pair of discharge electrodes provided in the first chamber and connected to the first magnetic compression circuit, and a first discharge timing detector configured to detect discharge between the first pair of discharge electrodes and output a first discharge detection signal. The second laser apparatus may include: a second delay circuit unit configured to receive the trigger signal and output a second delay signal representing that a second delay time has passed since the second delay circuit unit received the trigger signal, a second trigger-correction unit configured to receive the second delay signal and output a second switch signal representing that a second correction time has passed since the second trigger-correction unit received the second delay signal, a second clock generator configured to generate a clock signal that is common to the second delay circuit unit and the second trigger-correction unit, a second capacitor, a second charger configured to apply voltage to the second capacitor, a second switch configured to receive the second switch signal and allow the second capacitor to output a pulse current, a second magnetic compression circuit configured to compress the pulse current outputted from the second capacitor, a second chamber containing laser gas, a second pair of discharge electrodes provided in the second chamber and connected to the second magnetic compression circuit, and a second discharge timing detector configured to detect discharge between the second pair of discharge electrodes and output a second discharge detection signal. The first trigger-correction unit may receive the first discharge detection signal. The first trigger-correction unit may set the first correction time so that a first elapsed time between a timing of receiving the first delay signal and a timing of receiving the first discharge detection signal approaches a first target value. The second trigger-correction unit may receive the second discharge detection signal. The second trigger-correction unit may set the second correction time so that a second elapsed time between a timing of receiving the second delay signal and a timing of receiving the second discharge detection signal approaches a second target value.

BRIEF DESCRIPTION OF DRAWINGS

Exemplary embodiments of the present disclosure will be described below with reference to the appended drawings.

DESCRIPTION OF EMBODIMENTS

Contents

Figure 1:
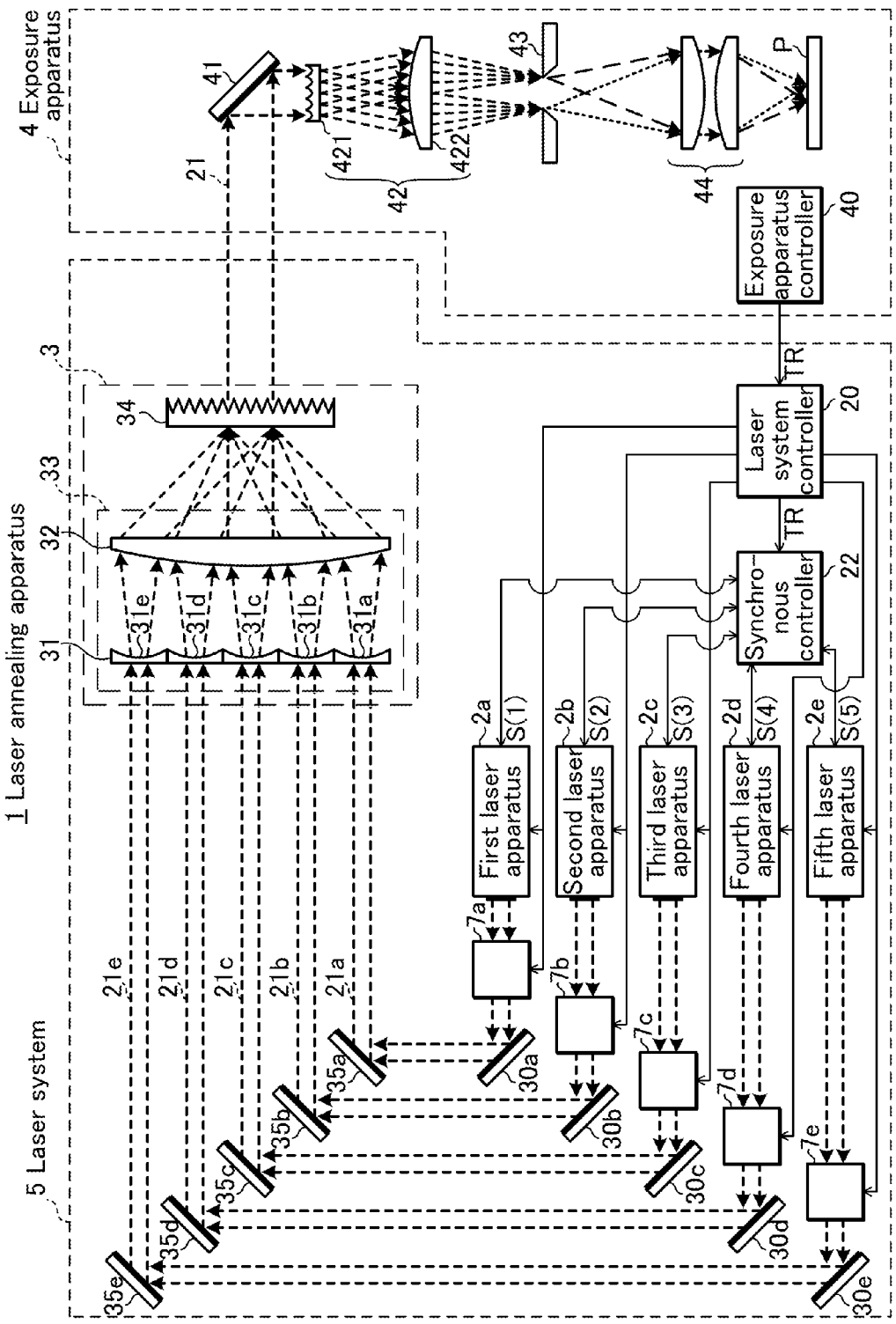
FIG. 1 schematically shows a configuration of a laser annealing apparatus including a laser system according to a first embodiment of the present disclosure.

1. Outline
2. Laser Annealing Apparatus Including Synchronous Controller (First Embodiment)
   2.1 Outline of Laser Apparatus
   2.2 Beam Bundling Device
   2.3 Exposure Apparatus
   2.4 Controller
   2.5 Details of Laser Apparatus
   2.6 Details of Synchronous Controller
   2.7 Timing Chart
   2.8 Flowcharts
      2.8.1 Processing of Laser System Controller
      2.8.2 Processing of Laser Controller
      2.8.3 Processing of Nth Trigger-correction Unit
3. Laser System Including Power Amplifier (Second Embodiment)
   3.1 Configuration of Laser Apparatus
   3.2 Details of Synchronous Controller
   3.3 Timing Chart
   3.4 Processing of Nth Trigger-correction Unit
4. Laser System, Each Laser Apparatus Including Trigger-correction Unit
   4.1 Third Embodiment
   4.2 Fourth Embodiment
5. Laser System Including Pulse Waveform Measuring Device (Fifth Embodiment)
   5.1 Configuration
   5.2 Pulse Waveform Measuring Device
   5.3 Controlling Operation
6. Others
   6.1 Optical Path Length Adjuster
   6.2 Beam Bundling Device Using Flat Mirrors
   6.3 Configuration of Controller Embodiments of the present disclosure will be described below in detail with reference to the drawings. The embodiments described below may present several examples of the present disclosure, and may not intend to limit the content of the present disclosure. Not all of the configurations and operations described in the embodiments are indispensable in the present disclosure. Identical reference symbols may be assigned to identical elements and redundant descriptions may be omitted.

1. Outline

A laser annealing apparatus may perform laser annealing by irradiating an amorphous silicon film on a glass substrate with a pulse laser beam at a predetermined energy density. The pulse laser beam may be demanded to increase its energy per one pulse for enlarging irradiation area at the predetermined energy density to manufacture larger and larger liquid crystal displays as in recent years. Increasing energy per one pulse may be achieved by bundling pulse laser beams emitted from respective laser apparatuses to form a bundled laser beam. The bundled laser beam may be applied to the amorphous silicon film.

The pulse laser beams emitted from the respective laser apparatuses may be stabilized in energy by controlling charging voltages applied by respective chargers of the laser apparatuses independently from each other. However, changes in the charging voltages applied by the respective chargers may cause changes in timings of electric discharge in the laser apparatuses. Such changes in the timings of the electric discharge may make it difficult to stabilize a pulse waveform of the bundled laser beam formed by the pulse laser beams emitted from the laser apparatuses. Failure to stabilize the pulse waveform of the bundled laser beam may degrade annealing quality.

According to one aspect of the present disclosure, a first trigger-correction unit may output a first switch signal S(1) representing that a first correction time Td(1) has passed since the first trigger-correction unit received a first delay signal TR(1). In a first laser apparatus, a first required time from the timing of receiving the first switch signal S(1) until the timing of emitting a first pulse laser beam may fluctuate. The first trigger-correction unit may set the first correction time Td(1) such that a sum of the first correction time Td(1) and the first required time approaches a target value TRdt.

A second trigger-correction unit may output a second switch signal S(2) representing that a second correction time Td(2) has passed since the second trigger-correction unit received a second delay signal TR(2). In a second laser apparatus, a second required time from the timing of receiving the second switch signal S(2) until the timing of emitting a second pulse laser beam may fluctuate independently from the first required time. The second trigger-correction unit may set the second correction time Td(2) such that a sum of the second correction time Td(2) and the second required time approaches the target value TRdt.

2. Laser Annealing Apparatus Including Synchronous Controller

First Embodiment

FIG. 1 schematically shows a configuration of a laser annealing apparatus including a laser system according to a first embodiment of the present disclosure. The laser annealing apparatus 1 may include a laser system 5 and an exposure apparatus 4. The laser system 5 may include first to fifth laser apparatuses 2a to 2e, high-reflective mirrors 30a to 30e, high-reflective mirrors 35a to 35e, first to fifth optical path length adjusters 7a to 7e, and a beam bundling device 3.

2.1 Outline of Laser Apparatus

Each of the first to fifth laser apparatuses 2a to 2e may be an excimer laser apparatus using laser medium such as XeF, XeCl, KrF, or ArF. The first to fifth laser apparatuses 2a to 2e may have substantially the same configurations with each other. The first to fifth laser apparatuses 2a to 2e may emit first to fifth pulse laser beams 21a to 21e, respectively. Each of the first to fifth pulse laser beams 21a to 21e may have a wavelength of an ultraviolet region.

The first to fifth optical path length adjusters 7a to 7e may be provided in respective optical paths of the first to fifth pulse laser beams 21a to 21e. The first to fifth optical path length adjusters 7a to 7e may adjust respective optical path lengths of the first to fifth pulse laser beams 21a to 21e. The optical path lengths between respective light-emitting positions of the first to fifth laser apparatuses 2a to 2e and a light-emitting position of the beam bundling device 3 may be adjusted to become substantially the same with each other. The high-reflective mirrors 30a to 30e and the high-reflective mirrors 35a to 35e may be provided in the respective optical paths of the first to fifth pulse laser beams 21a to 21e. The first to fifth pulse laser beams 21a to 21e may be introduced to the beam bundling device 3. FIG. 1 shows the five laser apparatuses; however, the number of the laser apparatuses may not be limited but may be an integer equal to or more than two.

2.2 Beam Bundling Device

The beam bundling device 3 may include incident optics 33 and a beam combiner 34.

The incident optics 33 may include secondary light source optics 31 and condenser optics 32, being designed to constitute a Koehler illumination.

The secondary light source optics 31 may include first to fifth concave lenses 31a to 31e.

The first concave lens 31a may be provided between the first optical path length adjuster 7a and the condenser optics 32 in the optical path of the first pulse laser beam 21a. The first concave lens 31a may transmit the first pulse laser beam 21a toward the condenser optics 32. The first concave lens 31a may expand beam width of the first pulse laser beam 21a.

The first to fifth concave lenses 31a to 31e may have substantially the same configurations with each other.

The second concave lens 31b may be provided in the optical path of the second pulse laser beam 21b.

The third concave lens 31c may be provided in the optical path of the third pulse laser beam 21c.

The fourth concave lens 31d may be provided in the optical path of the fourth pulse laser beam 21d.

The fifth concave lens 31e may be provided in the optical path of the fifth pulse laser beam 21e.

The first to fifth pulse laser beams 21a to 21e entering the first to fifth concave lenses 31a to 31e, respectively, may have substantially the same beam sizes and substantially the same beam divergences with each other.

Optical path axes of the first to fifth pulse laser beams 21a to 21e transmitted by the first to fifth concave lenses 31a to 31e, respectively, may be substantially parallel to each other. In the present disclosure, an "optical path axis" of a pulse laser beam may be a central axis of an optical path of the pulse laser beam.

The condenser optics 32 may be provided such that, as explained below, the first to fifth pulse laser beams 21a to 21e may be made incident on substantially the same portion of a light-receiving surface of the beam combiner 34 at respective predetermined incident angles.

The condenser optics 32 may extend over the cross sections of the optical paths of the first to fifth pulse laser beams 21a to 21e, at a position between the secondary light source optics 31 and the beam combiner 34. The condenser optics 32 may transmit the first to fifth pulse laser beams 21a to 21e toward the beam combiner 34. The condenser optics 32 may change respective directions of the optical path axes of the first to fifth pulse laser beams 21a to 21e to respective predetermined directions.

The condenser optics 32 may be provided such that a front-side focal plane of the condenser optics 32 substantially coincides with respective focal positions of the first to fifth concave lenses 31a to 31e. The condenser optics 32 may thus collimate each of the first to fifth pulse laser beams 21a to 21e transmitted by the respective concave lenses 31a to 31e, such that each of the beams has substantially parallel rays.

The condenser optics 32 may be provided such that a rear-side focal plane of the condenser optics 32 substantially coincides with the light-receiving surface of the beam combiner 34. Thus, the condenser optics 32 may make the first to fifth pulse laser beams 21a to 21e be incident on substantially the same portion of the beam combiner 34 at respective predetermined incident angles.

FIG. 1 shows that the condenser optics 32 may include a single convex lens. However, the condenser optics 32 may include a combination of the convex lens and another convex or concave lens (not shown), or include a concave mirror (not shown).

The beam combiner 34 may include a diffractive optical element (DOE). The diffractive optical element may be constituted by an ultraviolet-transmitting substrate, such as a synthetic quartz substrate or a calcium fluoride substrate, on which multiple grooves each having a predetermined shape are formed at a predetermined interval.

The first to fifth pulse laser beams 21a to 21e, having been changed their directions of the optical path axes by the condenser optics 32 to the respective predetermined directions, may enter the beam combiner 34. The first to fifth pulse laser beams 21a to 21e, which entered the beam combiner 34, may be emitted from the beam combiner 34 to directions substantially the same with each other. The above-mentioned respective predetermined directions may be designed such that the first to fifth pulse laser beams 21a to 21e are combined by the beam combiner 34. Such beam combiner 34 may be a diffractive optical element, for example, disclosed in U.S. Patent Application Publication No. 2009/0285076.

The first to fifth pulse laser beams 21a to 21e emitted from the beam combiner 34 may travel through substantially the same optical paths to enter the exposure apparatus 4.

The first to fifth pulse laser beams 21a to 21e may thus be bundled by the beam bundling device 3. In the following description, a pulse laser beam formed by bundling a plurality of pulse laser beams may be referred to as a "bundled laser beam" 21. The pulse energy of the bundled laser beam 21 may be approximately five times of the pulse energy of the pulse laser beam emitted from a single laser apparatus.

"Bundling" pulse laser beams may include making the pulse laser beams share a common optical path. Alternatively, "Bundling" pulse laser beams may include, as explained below with reference to FIG. 23, emitting pulse laser beams through respective optical paths which are close to each other.

2.3 Exposure Apparatus

The exposure apparatus 4 may include a high-reflective mirror 41, illumination optics 42, a mask 43, and transfer optics 44. The exposure apparatus 4 may apply the bundled laser beam 21, which is emitted from the laser system 5, to an irradiation object P according to a predetermined mask pattern.

The high-reflective mirror 41 may be provided in an optical path of the bundled laser beam 21 emitted from the laser system 5. The high-reflective mirror 41 may reflect the bundled laser beam 21 to make the bundled laser beam 21 enter the illumination optics 42. The bundled laser beam 21 entering the illumination optics 42 may have substantially parallel rays.

The illumination optics 42 may be provided between the high-reflective mirror 41 and the mask 43 in the optical path of the bundled laser beam 21. The illumination optics 42 may include a fly eye lens 421 and condenser optics 422, being designed to constitute a Koehler illumination.

The fly eye lens 421 may be provided between the high-reflective mirror 41 and the condenser optics 422 in the optical path of the bundled laser beam 21. The fly eye lens 421 may include a plurality of lenses arranged in a cross section of the bundled laser beam 21. The lenses may transmit respective parts of the bundled laser beam 21 toward the condenser optics 422 to expand beam widths of the respective parts.

The condenser optics 422 may be provided between the fly eye lens 421 and the mask 43 in the optical path of the bundled laser beam 21. The condenser optics 422 may irradiate the mask 43 with the bundled laser beam 21 emitted from the fly eye lens 421.

The condenser optics 422 may be provided such that a rear-side focal plane of the condenser optics 422 substantially coincides with a position of the mask 43. The condenser optics 422 may thus irradiate substantially the same portion of the mask 43 with the respective parts of the bundled laser beam 21 transmitted by the respective lenses of the fly eye lens 421.

FIG. 1 shows that the condenser optics 422 may include a single convex lens. However, the condenser optics 422 may include a combination of the convex lens and another convex or concave lens (not shown), or include a concave mirror (not shown).

According to the above-mentioned configuration, the illumination optics 42 may reduce variation in light intensity distribution in a cross section of the bundled laser beam 21, with which the mask 43 is irradiated.

The mask 43 may have a rectangular slit. The shape of the slit may constitute the mask pattern of the mask 43. The mask pattern of the mask 43 may not be limited to have the rectangular shape. The mask pattern may have any desired shape.

The transfer optics 44 may be provided between the mask 43 and the irradiation object P in the optical path of the bundled laser beam 21. The transfer optics 44 may be provided such that an image of the mask pattern of the mask 43 is transferred by the transfer optics 44 at a position substantially coinciding with a position where the irradiation object P shall be irradiated with the bundled laser beam. The transfer optics 44 may thus transfer the image of the mask pattern of the mask 43, irradiated with the bundled laser beam 21, to the irradiation object P.

The transfer optics 44 may include at least one convex lens. In another example, the transfer optics 44 may include a combination of a convex lens and a concave lens, or include a concave mirror. In still another example, the transfer optics 44 may include a cylindrical lens that transfers a lateral component of the image of the rectangular mask pattern to the irradiation object P.

The laser system 5 may thus emit the bundled laser beam 21 having higher pulse energy than the pulse energy of the pulse laser beam emitted from the single laser apparatus. Consequently, the laser annealing apparatus 1 may irradiate a large irradiation area of the irradiation object P with the bundled laser beam 21 at a predetermined pulse energy density required for annealing. Thus, large-sized liquid crystal displays may be efficiently manufactured.

2.4 Controller

The exposure apparatus 4 may include an exposure apparatus controller 40. The exposure apparatus controller 40 may perform control of moving a stage (not shown), which holds the irradiation object P, exchanging the irradiation objects P, or exchanging the masks 43. The exposure apparatus controller 40 may output a trigger signal TR to a laser system controller 20.

The laser system 5 may include the laser system controller 20 and a synchronous controller 22. The laser system controller 20 may send the trigger signal TR received from the exposure apparatus controller 40 to the synchronous controller 22. The synchronous controller 22 may send first to fifth switch signals S(1) to S(5) to the first to fifth laser apparatuses 2a to 2e, respectively, based on the trigger signal TR received from the laser system controller 20. The first to fifth laser apparatuses 2a to 2e may emit the respective pulse laser beams based on the respective switch signals received from the synchronous controller 22.

2.5 Details of Laser Apparatus

Figure 2:
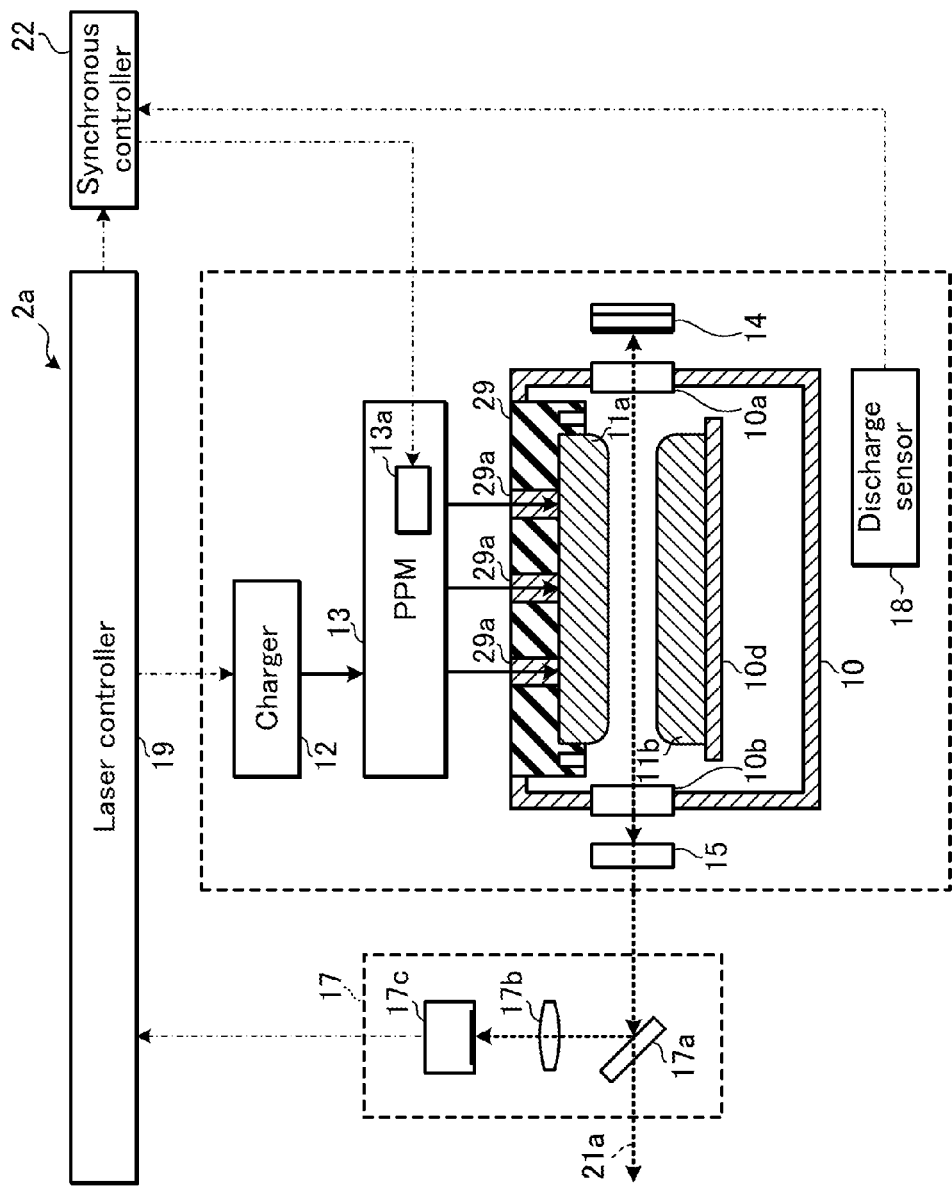
FIG. 2 shows an exemplary configuration of a laser apparatus shown in FIG. 1.

FIG. 2 shows an exemplary configuration of the laser apparatus shown in FIG. 1. The first laser apparatus 2a, for example, may include a laser chamber 10, a pair of discharge electrodes 11a and 11b, a charger 12, and a pulse power module (PPM) 13. The first laser apparatus 2a may further include a high-reflective mirror 14, an output coupling mirror 15, a pulse energy measuring unit 17, and a laser controller 19. The second to fifth laser apparatuses 2b to 2e may have the same configurations as that of the first laser apparatus 2a. FIG. 2 shows an internal configuration of the laser chamber 10 viewed in a direction substantially perpendicular to both the travelling direction of the pulse laser beam 21a and the electric discharge direction between the pair of discharge electrodes 11a and 11b.

The laser chamber 10 may store laser gases constituting a laser medium, including a rare gas such as argon, krypton or xenon, a buffer gas such as neon or helium, and a halogen gas such as chlorine or fluorine. The pair of electrodes 11a and 11b may be provided in the laser chamber 10 as electrodes for exciting the laser medium by the electric discharge. The laser chamber 10 may have an opening, sealed by an insulating member 29. The electrode 11a may be supported by the insulating member 29 and the electrode 11b may be supported by a return plate 10d. The return plate 10d may be electrically connected to an inner surface of the laser chamber 10 through electric wirings 10e and 10f described later with reference to FIG. 3. In the insulating member 29, conductive members 29a may be molded. The conductive members 29a may apply high-voltage, which is supplied by the pulse power module 13, to the electrode 11a.

The charger 12 may be a direct-current power source for charging a below-mentioned charge capacitor C0 of the pulse power module 13 at a predetermined voltage. The pulse power module 13 may include a switch 13a controlled by the laser controller 19. When the switch 13a turns ON, the pulse power module 13 may generate the pulsed high-voltage using electric energy in the charge capacitor C0. The high-voltage may be applied to the pair of electrodes 11a and 11b.

The high-voltage applied to the pair of electrodes 11a and 11b may cause dielectric breakdown and cause the electric discharge between the pair of electrodes 11a and 11b. Energy of the electric discharge may excite the laser medium in the laser chamber 10 to a high energy level. The excited laser medium may then change to a low energy level, where the laser medium generates light according to the difference of the energy levels.

The laser chamber 10 may have windows 10a and 10b at respective ends of the chamber. The light generated in the laser chamber 10 may be emitted from the laser chamber 10 through the windows 10a and 10b.

The high-reflective mirror 14 may reflect the light emitted from the window 10a of the laser chamber 10 at high reflectance to return the light to the laser chamber 10.

The output coupling mirror 15 may transmit to output a part of the light emitted from the window 10b of the laser chamber 10 and reflect to return another part of the light to the laser chamber 10.

The high-reflective mirror 14 and the output coupling mirror 15 may thus constitute an optical resonator. The light emitted from the laser chamber 10 may travel back and forth between the high-reflective mirror 14 and the output coupling mirror 15. The light may be amplified at every time to pass a laser gain region between the electrode 11a and the electrode 11b. The pulse laser beam 21a of the amplified light may be emitted through the output coupling mirror 15.

The pulse energy measuring unit 17 may be provided in the optical path of the pulse laser beam 21a emitted through the output coupling mirror 15. The pulse energy measuring unit 17 may include a beam splitter 17a, focusing optics 17b, and an optical sensor 17c.

The beam splitter 17a may transmit a part of the pulse laser beam 21a at high transmittance. The beam splitter 17a may reflect another part of the pulse laser beam 21a toward the focusing optics 17b. The focusing optics 17b may concentrate the pulse laser beam reflected by the beam splitter 17a on a light-receiving surface of the optical sensor 17c. The optical sensor 17c may detect the pulse energy of the pulse laser beam concentrated on the light-receiving surface and output data on the pulse energy to the laser controller 19.

The laser controller 19 may send and receive various signals to and from the laser system controller 20. The laser controller 19 may receive, for example, the trigger signal or data on target pulse energy from the laser system controller 20. The laser controller 19 may receive data on the pulse energy from the pulse energy measuring unit 17.

The laser controller 19 may control a setting value of the charging voltage of the charger 12 with reference to the data on the target pulse energy received from the laser system controller 20 and the data on the pulse energy received from the pulse energy measuring unit 17. By controlling the charging voltage of the charger 12, the pulse energy of the laser beam may be controlled.

Figure 3:
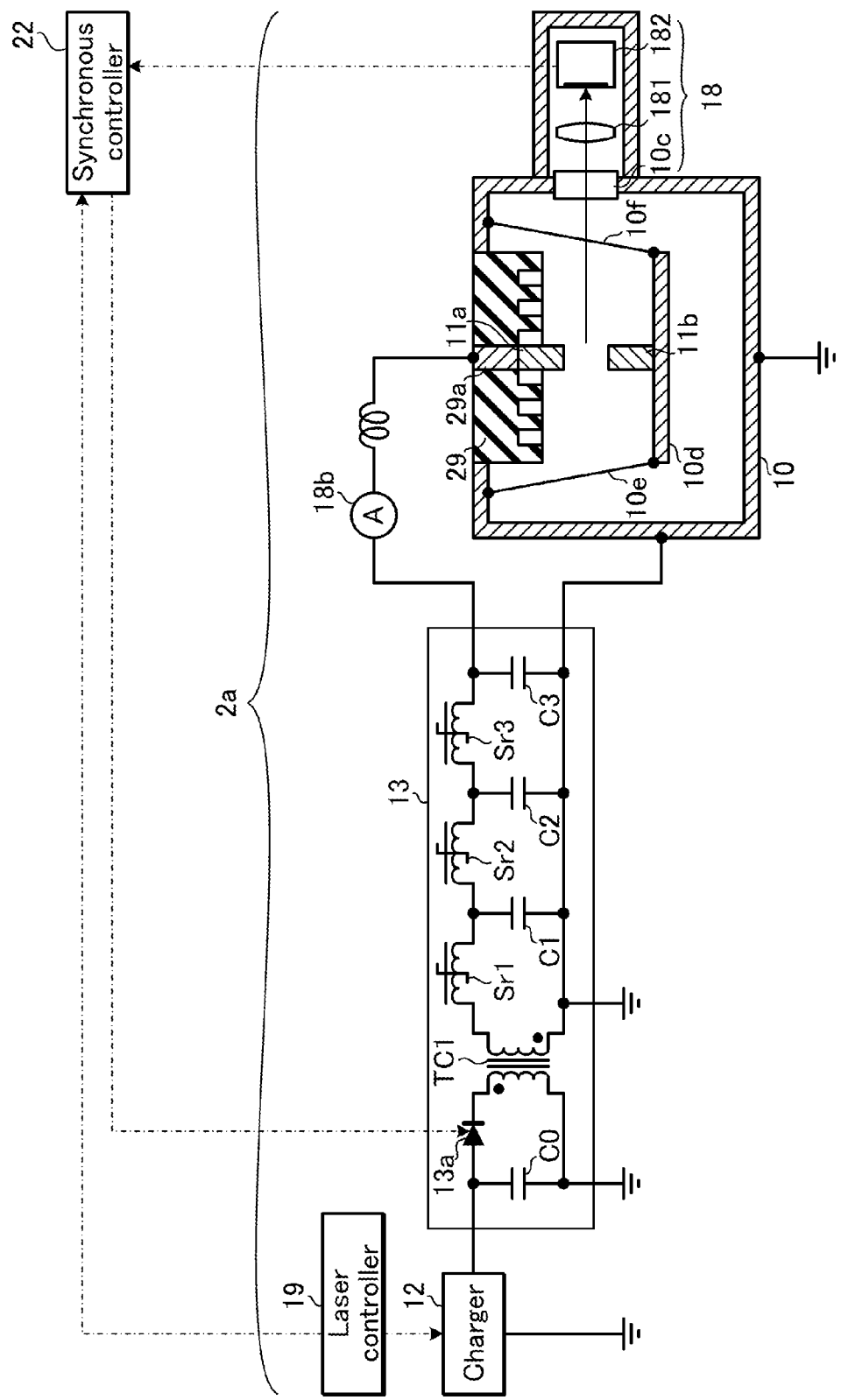
FIG. 3 shows a configuration of a pulse power module shown in FIG. 2 and an internal configuration of a laser chamber viewed from a direction substantially parallel to a travelling direction of the laser beam.

FIG. 3 shows a configuration of the pulse power module shown in FIG. 2 and an internal configuration of the laser chamber viewed from a direction substantially parallel to the travelling direction of the laser beam. Conductive members including the wall of the laser chamber 10 may be electrically connected to the ground potential. The electrode 11b may be electrically connected to the return plate 10d, the electric wirings 10e and 10f, and the wall of the laser chamber 10 and then connected to the ground potential.

The first laser apparatus 2a may include a discharge sensor 18. The discharge sensor 18 may include a window 10c attached to the laser chamber 10, focusing optics 181, and an optical sensor 182. The discharge sensor 18 may correspond to a discharge timing detector of the present disclosure.

The window 10c may transmit the light generated by the electric discharge between the pair of electrodes 11a and 11b. The focusing optics 181 may concentrate the light transmitted by the window 10c on a light-receiving surface of the optical sensor 182. The optical sensor 182 may include a photodiode or a photoelectric tube. The optical sensor 182 may detect the light generated by the electric discharge between the pair of electrodes 11a and 11b and then send a discharge detection signal to the synchronous controller 22.

The pulse power module 13 may include the charge capacitor C0, the switch 13a, a boosting transformer TC1 as a magnetic compression circuit, a plurality of magnetic switches Sr1 to Sr3, and a plurality of capacitors C1 to C3.

Each of the magnetic switches Sr1 to Sr3 may include a saturable reactor. Each of the magnetic switches Sr1 to Sr3 may be switched to a low impedance state when a time integral of the voltage across the magnetic switch becomes a predetermined value that depends on the characteristics of the magnetic switch.

In the charger 12, a setting value V(n) of the charging voltage may be set by the laser controller 19. The charger 12 may charge the charge capacitor C0 according to the setting value V(n) of the charging voltage.

The switch 13a in the pulse power module 13 may receive the switch signal from the synchronous controller 22. Upon receiving the switch signal, the switch 13a may turn ON. When the switch 13a turns ON, electric current may flow from the charge capacitor C0 to a primary side of the boosting transformer TC1.

The electric current through the primary side of the boosting transformer TC1 in a first direction may cause induced current through a secondary side of the boosting transformer TC1 in a second direction opposite to the first direction. The electric current through the secondary side of the boosting transformer TC1 may allow the time integral of the voltage across the magnetic switch Sr1 to reach a threshold value.

When the time integral of the voltage across the magnetic switch Sr1 reaches the threshold value, the magnetic switch Sr1 may be closed due to magnetic saturation.

Closing the magnetic switch Sr1 may allow electric current to flow from the secondary side of the boosting transformer TC1 to the capacitor C1 and to charge the capacitor C1.

As the capacitor C1 is charged, the magnetic switch Sr2 may be closed due to magnetic saturation.

Closing the magnetic switch Sr2 may allow electric current to flow from the capacitor C1 to the capacitor C2 and to charge the capacitor C2. Here, the electric current to charge the capacitor C2 may have a shorter pulse width than the electric current to charge the capacitor C1.

As the capacitor C2 is charged, the magnetic switch Sr3 may be closed due to magnetic saturation.

Closing the magnetic switch Sr3 may allow electric current to flow from the capacitor C2 to the capacitor C3 and to charge the capacitor C3. Here, the electric current to charge the capacitor C3 may have a shorter pulse width than the electric current to charge the capacitor C2.

The pulse width of the electric current may thus be compressed while the electric current flows from the capacitor C1 to the capacitor C2 and from the capacitor C2 to the capacitor C3, sequentially.

When the voltage across the capacitor C3 reaches a breakdown voltage of the laser gas, dielectric breakdown may occur in the laser gas between the pair of electrodes 11a and 11b. The laser gas may then be excited, laser oscillation may occur, and the pulse laser beam may be emitted. As the switch 13a operates, discharging operation described above may be repeated and the pulse laser beam may be emitted in a predetermined repetition frequency. A current meter 18b, which detects electric discharge current, may be used as the discharge timing detector. The current meter 18b may be an electric current probe to detect the timing of the electric discharge.

The pulse energy measuring unit 17 to output an output signal of the pulse laser beam may be used as the discharge timing detector instead of the discharge sensor. A timing signal from the discharge sensor or the output signal of the pulse laser beam may be inputted as the discharge detection signal to the synchronous controller 22 described later.

2.6 Details of Synchronous Controller

Figure 4:
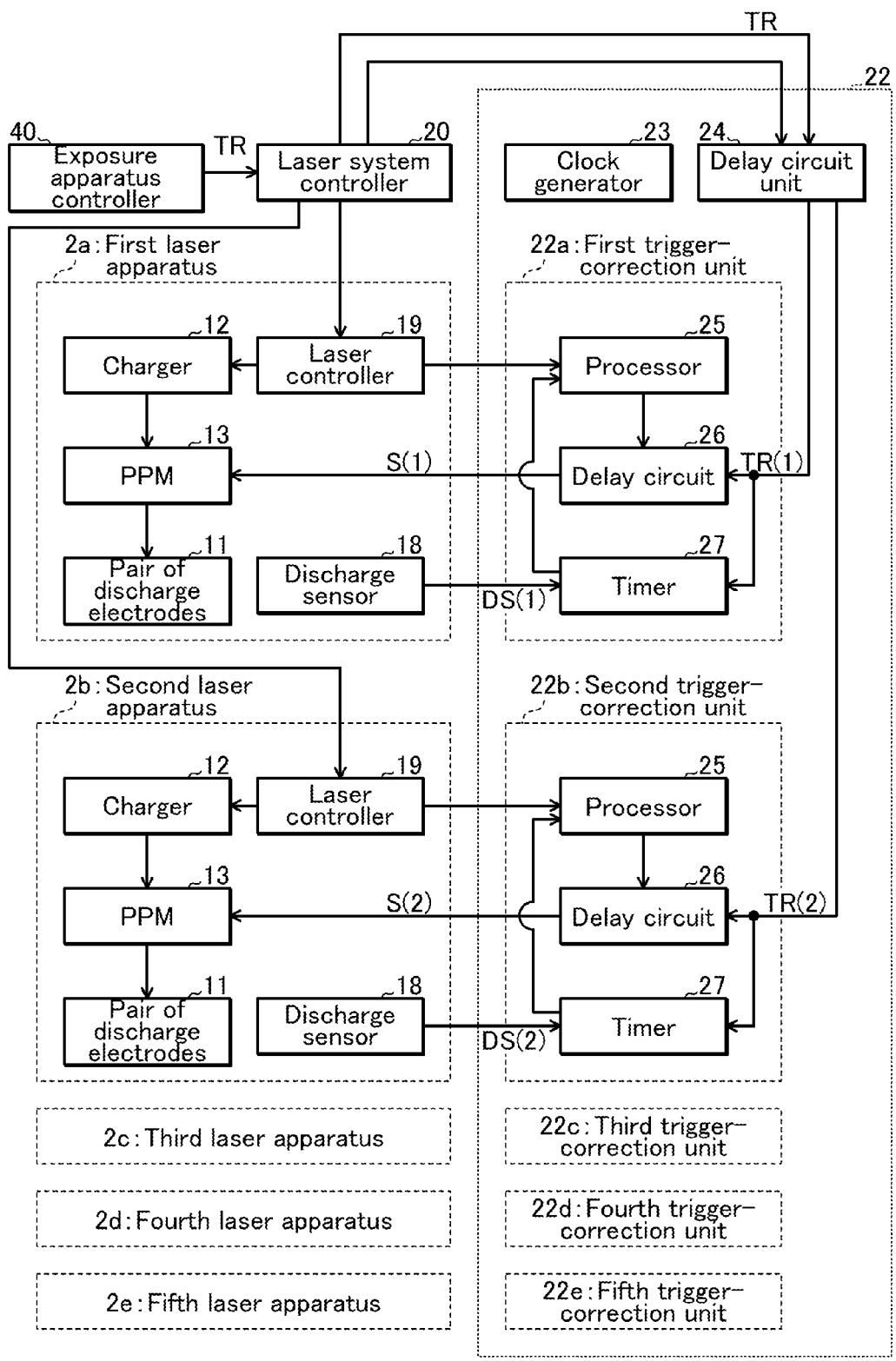
FIG. 4 is a block diagram illustrating a synchronous controller and its periphery shown in FIG. 1.

FIG. 4 is a block diagram illustrating a synchronous controller and its periphery shown in FIG. 1. The synchronous controller 22 may include first to fifth trigger-correction units 22a to 22e, a clock generator 23, and a delay circuit unit 24. Each of the first to fifth trigger-correction units 22a to 22e may include a processor 25, a delay circuit 26, and a timer 27. FIG. 4 shows the configuration of the first and second trigger-correction units 22a and 22b. Detailed descriptions for each of the third to fifth trigger-correction units 22c to 22e, which may be substantially the same as that of the first or the second trigger-correction unit 22a or 22b, may be omitted.

As shown in FIG. 4, each of the first to fifth laser apparatuses 2a to 2e may include a pair of discharge electrodes 11, the charger 12, the pulse power module 13, the discharge sensor 18, and the laser controller 19. FIG. 4 shows the configuration of the first and second laser apparatuses 2a and 2b. Detailed description for each of the third to fifth laser apparatuses 2c to 2e, which may be substantially the same as that of the first or the second laser apparatus 2a or 2b, may be omitted.

The synchronous controller 22 may receive data representing a first delay time TRd(1) of the first delay signal TR(1) and data representing a second delay time TRd(2) of the second delay signal TR(2) from the laser system controller 20.

In the synchronous controller 22, the clock generator 23 may generate a clock signal that is common to the first to fifth trigger-correction units 22a to 22e and the delay circuit unit 24. The delay circuit unit 24 may receive the trigger signal TR outputted from the laser system controller 20.

The delay circuit unit 24 may output the first delay signal TR(1) to the delay circuit 26 and the timer 27 of the first trigger-correction unit 22a. The first delay signal TR(1) may indicate that the first delay time TRd(1) (see FIGS. 5 and 6) has passed since the delay circuit unit 24 received the trigger signal TR.

The delay circuit unit 24 may output the second delay signal TR(2) to the delay circuit 26 and the timer 27 of the second trigger-correction unit 22b. The second delay signal TR(2) may indicate that the second delay time TRd(2) (see FIGS. 5 and 6) has passed since the delay circuit unit 24 received the trigger signal TR.

The delay circuit 26 of the first trigger-correction unit 22a may output the first switch signal S(1) to the pulse power module 13 of the first laser apparatus 2a. The first switch signal S(1) may represent that the first correction time Td(1) (see FIG. 6) has passed since the delay circuit 26 of the first trigger-correction unit 22a received the first delay signal TR(1). The first correction time Td(1) may be set by the processor 25 of the first trigger-correction unit 22a.

The delay circuit 26 of the second trigger-correction unit 22b may output the second switch signal S(2) to the pulse power module 13 of the second laser apparatus 2b. The second switch signal S(2) may represent that the second correction time Td(2) (see FIG. 6) has passed since the delay circuit 26 of the second trigger-correction unit 22b received the second delay signal TR(2). The second correction time Td(2) may be set by the processor 25 of the second trigger-correction unit 22b.

The laser controller 19 in each of the first and second laser apparatuses 2a and 2b may receive data on the target pulse energy from the laser system controller 20. The laser controller 19 may calculate the setting value of the charging voltage based on the data on the target pulse energy. The laser controller 19 may send the setting value of the charging voltage to the charger 12 and the processor 25 of the corresponding trigger-correction unit. The charger 12 may charge the charge capacitor C0 of the pulse power module 13 according to the setting value of the charging voltage. The pulse power module 13 may include the magnetic compression circuit described above with reference to FIG. 3.

The pulse power modules 13 of the first and second laser apparatuses 2a and 2b may receive the first and second switch signals S(1) and S(2), respectively, outputted from the delay circuit 26. The switches 13a of the pulse power modules 13 of the first and second laser apparatuses 2a and 2b may turn ON according to the switch signals S(1) and S(2), respectively. When one of the switches 13a turns ON, the corresponding pulse power module 13 may generate the pulsed high-voltage using electric energy in the charge capacitor C0. The high-voltage may be applied to the pair of discharge electrodes 11.

The high-voltage applied to the pair of discharge electrodes 11 may cause the dielectric breakdown and cause the electric discharge between the pair of discharge electrodes 11. Energy of the electric discharge may excite the laser medium, from which the light may be generated. The light may travel back and forth in the above-described optical resonator, from which the pulse laser beam may be generated.

The discharge sensor 18 of the first laser apparatus 2a may detect the electric discharge between the pair of discharge electrodes 11 and output a first discharge detection signal DS(1). The discharge sensor 18 of the second laser apparatus 2b may detect the electric discharge between the corresponding pair of discharge electrodes 11 and output a second discharge detection signal DS(2). The first and second discharge detection signals DS(1) and DS(2) may be inputted to the timers 27 of the first and second trigger-correction units 22a and 22b, respectively.

The timer 27 of the first trigger-correction unit 22a may measure a first elapsed time TRdm(1), from the timing of receiving the first delay signal TR(1) until the timing of receiving the first discharge detection signal DS(1), and send the first elapsed time TRdm(1) to the processor 25. The timer 27 of the second trigger-correction unit 22b may measure a second elapsed time TRdm(2), from the timing of receiving the second delay signal TR(2) until the timing of receiving the second discharge detection signal DS(2), and send the second elapsed time TRdm(2) to the processor 25.

The processor 25 of the first trigger-correction unit 22a may set the first correction time Td(1) based on the setting value of the charging voltage sent from the laser controller 19 of the first laser apparatus 2a and on the first elapsed time TRdm(1) sent from the timer 27.

The processor 25 of the second trigger-correction unit 22b may set the second correction time Td(2) based on the setting value of the charging voltage sent from the laser controller 19 of the second laser apparatus 2b and on the second elapsed time TRdm(2) sent from the timer 27.

2.7 Timing Chart

Figure 5:
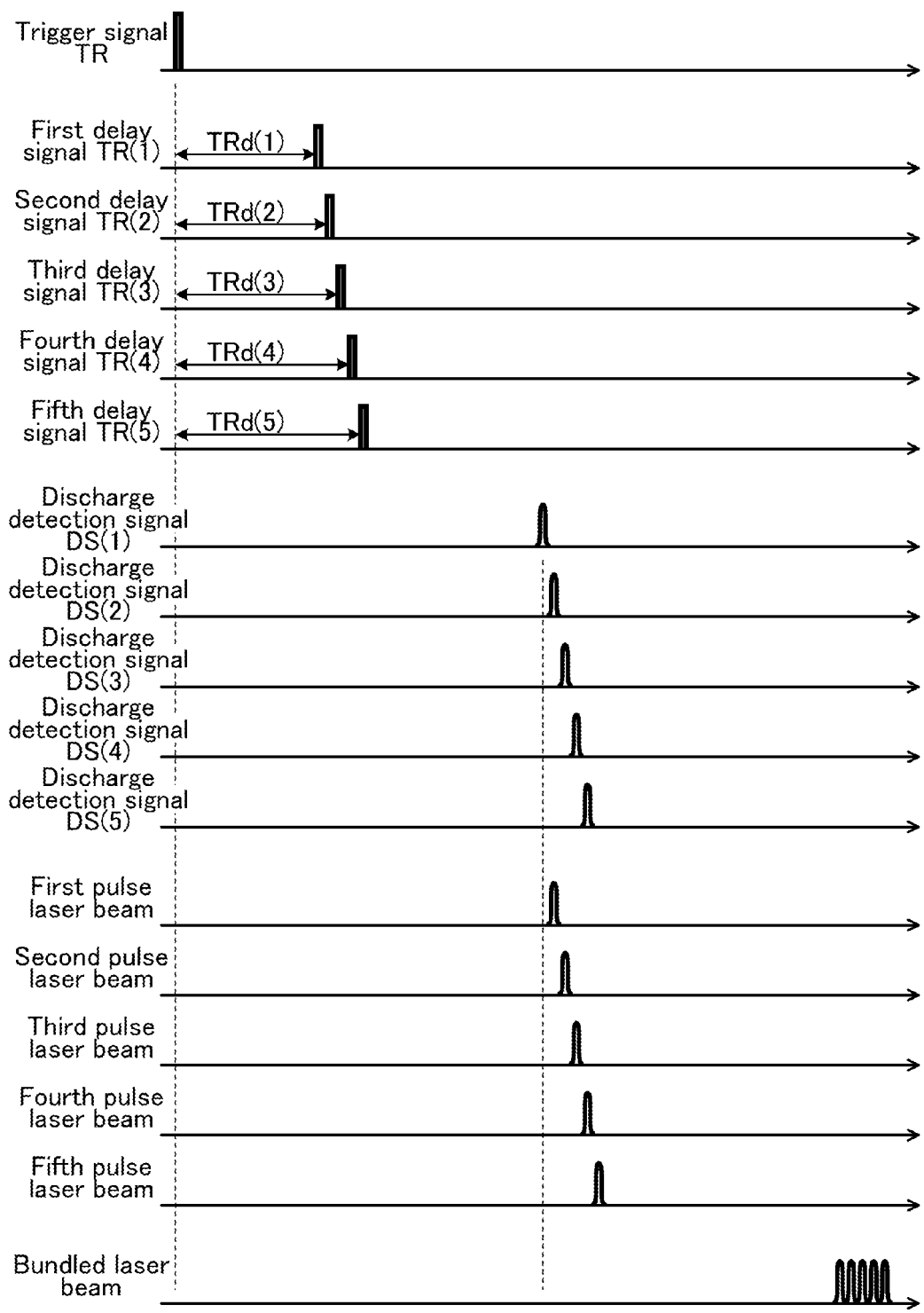
FIG. 5 is a timing chart of the laser system shown in FIG. 1.

FIG. 5 is a timing chart of the laser system shown in FIG. 1. The laser system controller 20 may send the trigger signal TR from the exposure apparatus controller 40 to the synchronous controller 22.

The delay circuit unit 24 of the synchronous controller 22 may output the first to fifth delay signals TR(1) to TR(5) to the first to fifth trigger-correction units 22a to 22e, respectively. The first to fifth delay signals may, respectively, represent that the first to fifth delay times TRd(1) to TRd(5) different from each other have passed since the delay circuit unit 24 received the trigger signal TR.

Time periods from the output timings of the first to fifth delay signals TR(1) to TR(5) until the output timings of the first to fifth discharge detection signals DS(1) to DS(5), respectively, may preferably be controlled to be substantially the same with each other. In that case, the first to fifth discharge detection signals DS(1) to DS(5) may be outputted sequentially in time differences substantially equal to time differences of the first to fifth delay signals TR(1) to TR(5).

The first to fifth pulse laser beams 21a to 21e may be emitted from the first to fifth laser apparatuses 2a to 2e, respectively. The first to fifth pulse laser beams 21a to 21e may be emitted at the timings substantially the same with the timings of the first to fifth discharge detection signals DS(1) to DS(5). Alternatively, the first to fifth pulse laser beams 21a to 21e may be emitted at the timings slightly delayed from the timings of the first to fifth discharge detection signals DS(1) to DS(5).

Optical path length from the light-emitting positions of the first to fifth laser apparatuses 2a to 2e to the light-emitting position of the beam bundling device 3 may be adjusted, as mentioned above, to become substantially the same with each other. In that case, the bundled laser beam 21 from the beam bundling device 3 may be a combination of the first to fifth pulse laser beams 21a to 21e having a time difference substantially the same as the time difference of the first to fifth delay signals TR(1) to TR(5). By controlling the timings of the first to fifth delay signals TR(1) to TR(5), the pulse waveform of the bundled laser beam 21 may be controlled.

The optical path lengths from the light-emitting positions of the first to fifth laser apparatuses 2a to 2e to the light-emitting positions of the beam bundling device 3 may be different from each other. In that case, the timings of the first to fifth delay signals TR(1) to TR(5) may be corrected by using values obtained by dividing the differences in the optical path lengths by the velocity of light.

Figure 6:
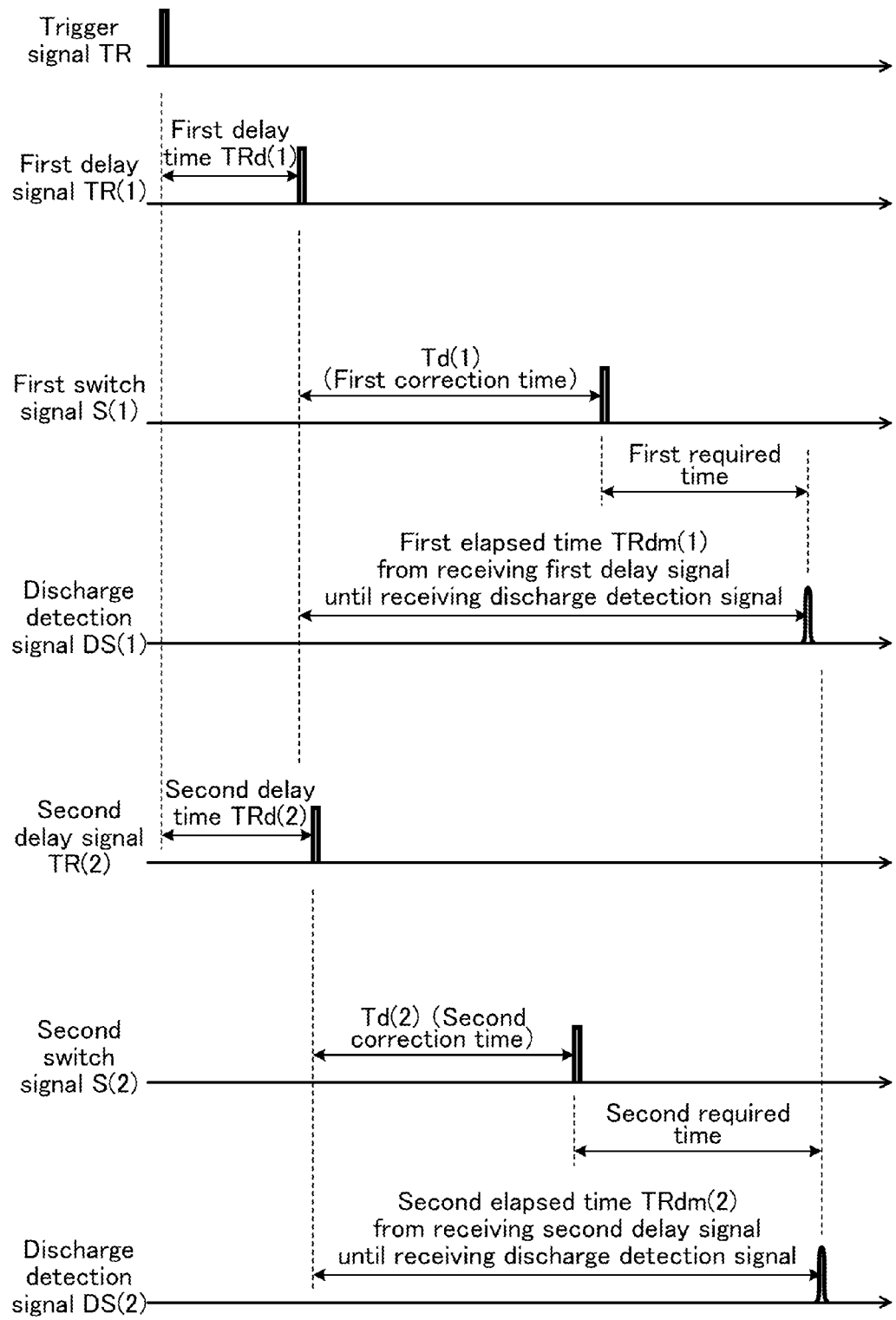
FIG. 6 is a timing chart of first and second trigger-correction units shown in FIG. 4.

FIG. 6 is a timing chart of the first and second trigger-correction units shown in FIG. 4.

In FIG. 6, illustration is omitted for the third to fifth delay signals TR(3) to TR(5) outputted from the third to fifth trigger-correction units 22c to 22e, respectively, and for the third to fifth discharge detection signals DS(3) to DS(5) outputted from the third to fifth laser apparatuses 2c to 2e, respectively.

As shown in FIG. 6, the first delay signal TR(1) and the second delay signal TR(2) may have a predetermined time difference. Here, a first required time in the first laser apparatus 2a from the timing of receiving the first switch signal S(1) until the timing of generating the first pulse laser beam may fluctuate depending on the charging voltage of the charger 12 in the first laser apparatus 2a. A second required time in the second laser apparatus 2b from the timing of receiving the second switch signal S(2) until the timing of generating the second pulse laser beam may fluctuate depending on the charging voltage of the charger 12 in the second laser apparatus 2b. These charging voltages may be controlled in the first laser apparatus 2a and the second laser apparatus 2b separately from each other. The first required time and the second required time may thus fluctuate separately from each other. Further, the first required time and the second required time may fluctuate also depending on temperature of the magnetic compression circuits in the respective pulse power modules 13.

The first elapsed time TRdm(1) in the timer 27, from the timing of receiving the first delay signal TR(1) until the timing of receiving the first discharge detection signal DS(1), may correspond to a sum of the first correction time Td(1) and the first required time. The second elapsed time TRdm(2) in the timer 27, from the timing of receiving the second delay signal TR(2) until the timing of receiving the second discharge detection signal DS(2), may correspond to a sum of the second correction time Td(2) and the second required time.

To make the first elapsed time TRdm(1) approach its target value, the first correction time Td(1) may need to be controlled according to fluctuation of the first required time. To make the second elapsed time TRdm(2) approach its target value, the second correction time Td(2) may need to be controlled according to fluctuation of the second required time.

By making the first elapsed time TRdm(1) and the second elapsed time TRdm(2) approach the respective target values, the first pulse laser beam 21a and the second pulse laser beam 21b may be generated at the same time difference with the time difference between the first delay signal TR(1) and the second delay signal TR(2).

Figure 7:
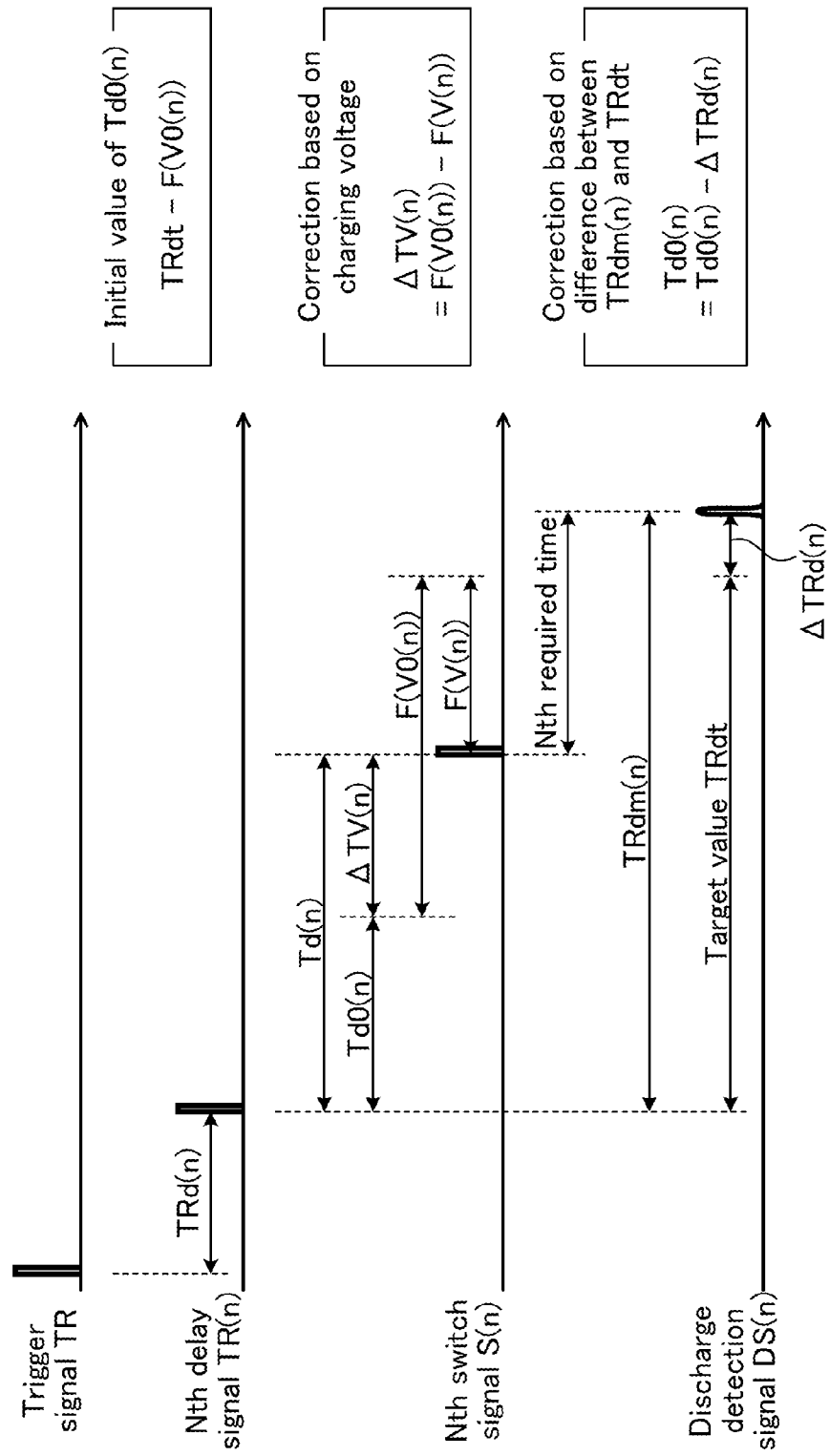
FIG. 7 is a timing chart illustrating a specific correction process in an Nth trigger-correction unit.

FIG. 7 is a timing chart illustrating a specific correction process in an Nth trigger-correction unit. In the following description, each of the first to fifth trigger-correction units 22a to 22e may be referred to as an Nth trigger-correction unit 22n. Further, signals inputted to or outputted from the Nth trigger-correction unit 22n may be denoted with symbols each accompanied by "(n)", or times to be set for the Nth trigger-correction unit 22n may be denoted with symbols each accompanied by "(n)".

An Nth correction time Td(n) may be calculated as follows.

$$Td(n)=Td0(n)+\Delta TV(n)$$

Here, Td0(n) may represent a first correction element and $\Delta TV(n)$ may represent a second correction element.

An initial value of the first correction element Td0(n) may be set as follows.

$$\text{Initial value of } Td0(n)=TRdt-F(V0(n))$$

Here, TRdt may represent a target value of an Nth elapsed time TRdm(n). The Nth elapsed time TRdm(n) may be an elapsed time in the timer 27 from the timing of receiving an Nth delay signal TR(n) until the timing of receiving an Nth discharge detection signal DS(n). The target value TRdt of the Nth elapsed time TRdm(n) may be a common value for the first to fifth trigger-correction units 22a to 22e. However, target values different from each other may be set.

In the above formula, F(V0(n)) may be a calculated value of a required time from the timing of inputting an Nth switch signal S(n) until the timing of outputting the Nth discharge detection signal DS(n), in a case where the setting value V(n) of the charging voltage in an Nth laser apparatus 2n is a predetermined standard voltage value V0(n). Where the charging voltage V is simply changed by the charger 12 in the magnetic compression circuit of the pulse power module 13, a product of the charging voltage V and the required time T from the timing of inputting the Nth switch signal S(n) to the switch 13a until the timing of applying the pulsed high-voltage between the discharge electrodes 11 may be substantially a constant value K. F(V0(n)) may be calculated as follows.

$$F(V0(n))=K/V0(n)$$

Here, V0(n) may represent the standard voltage value.

If the setting value of the charging voltage in the Nth laser apparatus 2n is a value V(n) different from the predetermined standard voltage value V0(n), the second correction element $\Delta TV(n)$ may be calculated as follows.

$$\Delta TV(n)=F(V0(n))-F(V(n))$$

Here, F(V(n)) may be a calculated value of the required time from the timing of inputting the Nth switch signal S(n) until the timing of outputting the Nth discharge detection signal DS(n), assuming that the setting value of the charging voltage in the Nth laser apparatus 2n is V(n). F(V(n)) may be calculated as follows.

$$F(V(n))=K/V(n)$$

Calculating the second correction element $\Delta TV(n)$ based on the setting value V(n) of the charging voltage as mentioned above may enable a high-speed control on timing of the Nth switch signal S(n).

The processor 25 of the Nth trigger-correction unit 22n may receive the Nth elapsed time TRdm(n) in the timer 27 from the timing of receiving the Nth delay signal TR(n) until the timing of receiving the Nth discharge detection signal DS(n). In that case, the processor 25 may calculate difference $\Delta TRd(n)$ between the Nth elapsed time TRdm(n) and the target value TRdt. The difference $\Delta TRd(n)$ may be calculated as follows.

$$\Delta TRd(n)=\text{AVG}(TRdm(n))-TRdt$$

Here, AVG(TRdm(n)) may be an average value of TRdm(n) where TRdm(n) is measured more than once.

The first correction element Td0(n) may be updated as follows using the calculated difference $\Delta TRd(n)$.

$$Td0(n)=Td0(n)-\Delta TRd(n)$$

Updating the first correction element Td0(n) based on the difference $\Delta TRd(n)$ between the average value of the Nth elapsed time TRd(n) and the target value TRdt may enable a correction in response to change in an Nth required time depending on, for example, the temperature of the magnetic compression circuit or the gas pressure in the laser chamber. The timing control of the Nth switch signal S (n) may thus be correctly performed. In this disclosure, changes in the timing of discharge depending on the temperature of the magnetic compression circuit or the gas pressure in the laser chamber may be referred to as "drift changes".

2.8 Flowcharts

2.8.1 Processing of Laser System Controller

Figure 8:
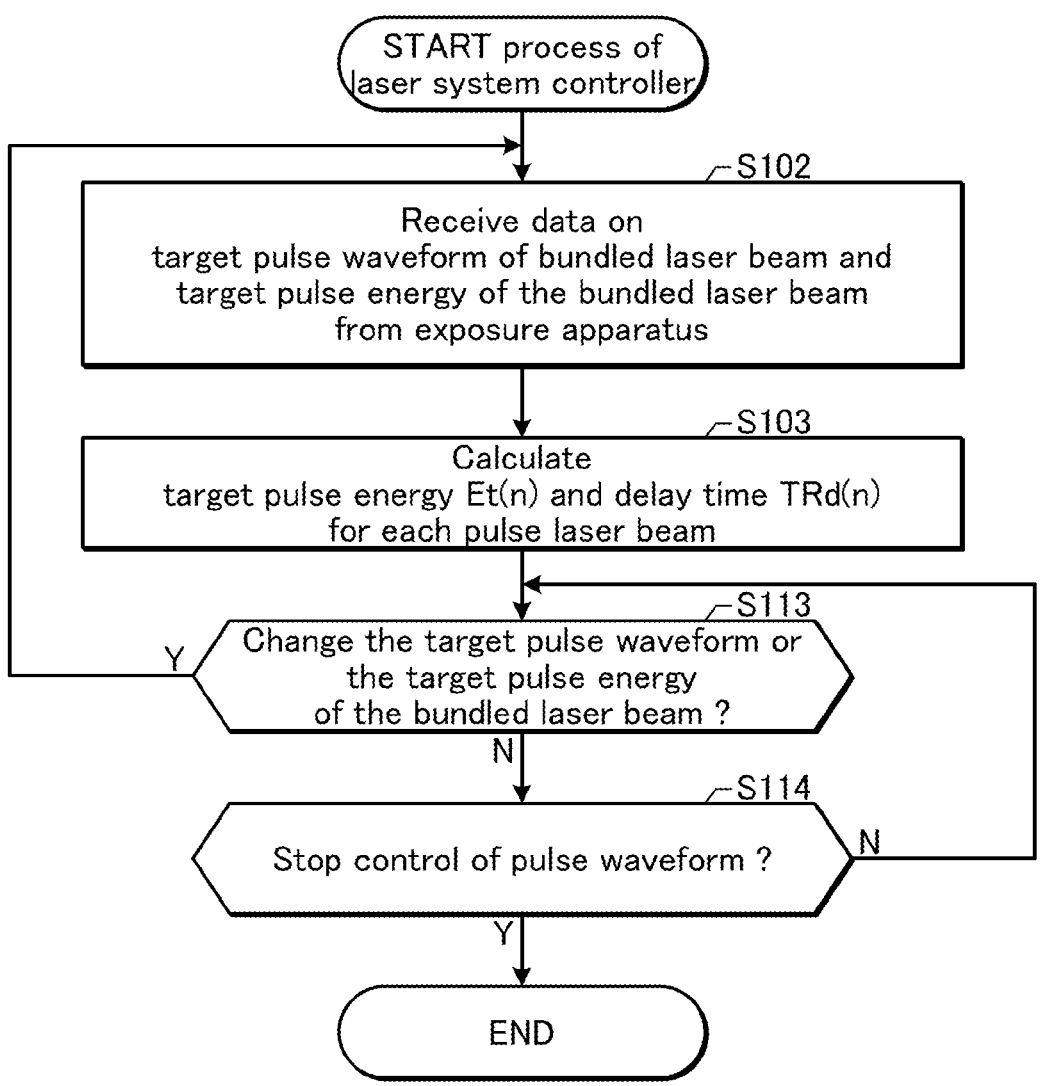
FIG. 8 is a flowchart illustrating a process of a laser system controller shown in FIG. 1.

FIG. 8 is a flowchart illustrating a process of the laser system controller shown in FIG. 1. The laser system controller 20 may control a target pulse energy Et(n) and an Nth delay time TRd(n) for an Nth pulse laser beam 21n emitted from one of the first to fifth laser apparatuses 2a to 2e through the processing described below.

First, at S102, the laser system controller 20 may receive data on the target pulse waveform of the bundled laser beam 21 and the data on the target pulse energy of the bundled laser beam 21 from the exposure apparatus controller 40 of the exposure apparatus 4.

Next, at S103, the laser system controller 20 may calculate the target pulse energy Et(n) and the Nth delay time TRd(n) for each of the Nth pulse laser beam 21n. If, for example, the target pulse waveform of the bundled laser beam 21 has a short pulse width, the first to fifth delay times TRd(1) to TRd(5) may be set to close values to each other. Further, the target pulse energy Et(n) of the Nth pulse laser beam 21n may be set such that sum of the target pulse energies Et(n) of the first to fifth pulse laser beams 21a to 21e may approach the target pulse energy of the bundled laser beam 21.

The laser system controller 20 may send the calculated target pulse energy Et(n) for the Nth pulse laser beam 21n to the laser controller 19 of the corresponding laser apparatus.

The laser system controller 20 may send the calculated Nth delay time TRd(n) for the Nth pulse laser beam 21n to the delay circuit unit 24 of the synchronous controller 22.

Next, at S113, the laser system controller 20 may determine whether the target pulse waveform of the bundled laser beam 21 and the target pulse energy of the bundled laser beam 21 should be changed. If the target should be changed (S113: YES), the laser system controller 20 may return to the above S102. If the target should not be changed (S113: NO), the laser system controller 20 may proceed to S114.

Next, at S114, the laser system controller 20 may determine whether the control of the pulse waveform should be stopped. If the control of the pulse waveform should not be stopped (S114: NO), the laser system controller 20 may return to the above S113. If the control of the pulse waveform should be stopped (S114: YES), the laser system controller 20 may terminate the processing of this flowchart.

As described above, the laser system controller 20 may calculate the target pulse energy Et(n) and the Nth delay time TRd(n).

2.8.2 Processing of Laser Controller

Figure 9:
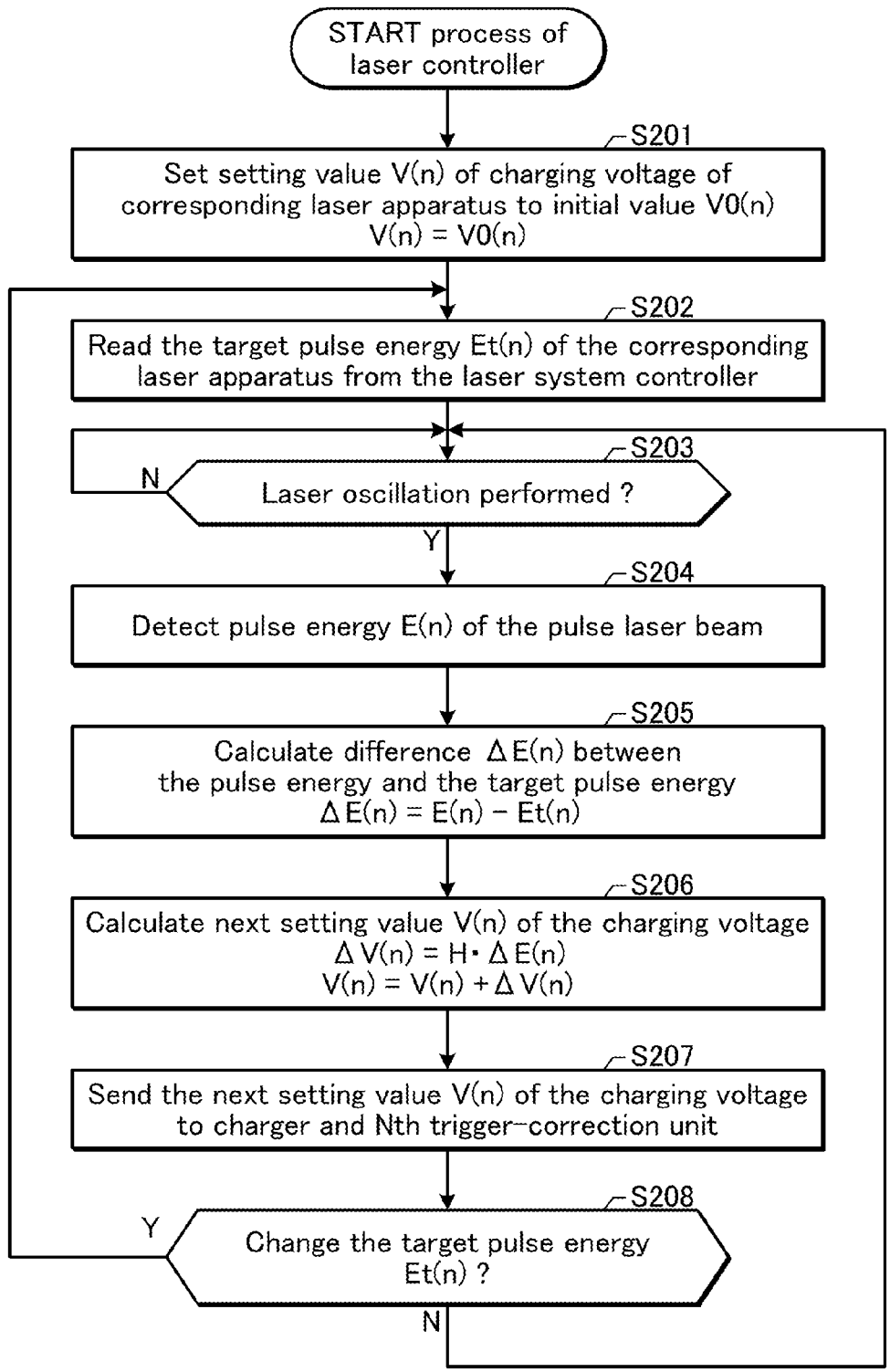
FIG. 9 is a flowchart illustrating a process of a laser controller shown in FIG. 4.

FIG. 9 is a flowchart illustrating a process of the laser controller shown in FIG. 4. The laser controller 19 in each of the first to fifth laser apparatuses 2a to 2e may, through the processing described below, calculate the setting value V(n) of the charging voltage based on the target pulse energy Et(n).

First, at S201, the laser controller 19 may set the setting value V(n) of the charging voltage of the corresponding laser apparatus 2n to an initial value. The initial value of the setting value of the charging voltage may be the standard voltage value V0(n) mentioned above.

Next, at S202, the laser controller 19 may read the target pulse energy Et(n) of the laser apparatus 2n from the laser system controller 20.

Next, at S203, the laser controller 19 may determine whether the laser apparatus 2n has performed laser oscillation. If the laser apparatus 2n has not performed laser oscillation (S203: NO), the laser controller 19 may standby until the laser apparatus 2n performs laser oscillation. If the laser apparatus 2n has performed laser oscillation (S203: YES), the laser controller 19 may proceed to S204.

At S204, the laser controller 19 may detect pulse energy E(n) of the pulse laser beam 21n emitted from the laser apparatus 2n. The pulse energy E(n) may be detected by the pulse energy measuring unit 17.

Next, at S205, the laser controller 19 may calculate difference $\Delta E(n)$ between the detected pulse energy E(n) and the target pulse energy Et(n) as follows.

$$\Delta E(n) = E(n) - Et(n)$$

Next, at S206, the laser controller 19 may calculate change amount $\Delta V(n)$ of the setting value of the charging voltage based on the difference $\Delta E(n)$ from the target pulse energy as follows.

$$\Delta V(n) = H \cdot \Delta E(n)$$

Here, H may be a proportional constant. The change amount $\Delta V(n)$ of the setting value of the charging voltage may indicate change amount to be made in the next setting value of the charging voltage. The laser controller 19 may calculate the next setting value V(n) of the charging voltage as follows.

$$V(n) = V(n) + \Delta V(n)$$

Next, at S207, the laser controller 19 may send the next setting value V(n) of the charging voltage to the charger 12 and to the processor 25 of the Nth trigger-correction unit 22n.

Next, at S208, the laser controller 19 may determine whether the target pulse energy Et(n) should be changed. If the target pulse energy Et(n) should be changed (S208: YES), the laser controller may return to the above S202. If the target pulse energy Et(n) should not be changed (S208: NO), the laser controller may return to the above S203.

The laser controller 19 may calculate the setting value V(n) of the charging voltage as described above.

2.8.3 Processing of Nth Trigger-Correction Unit

Figure 10:
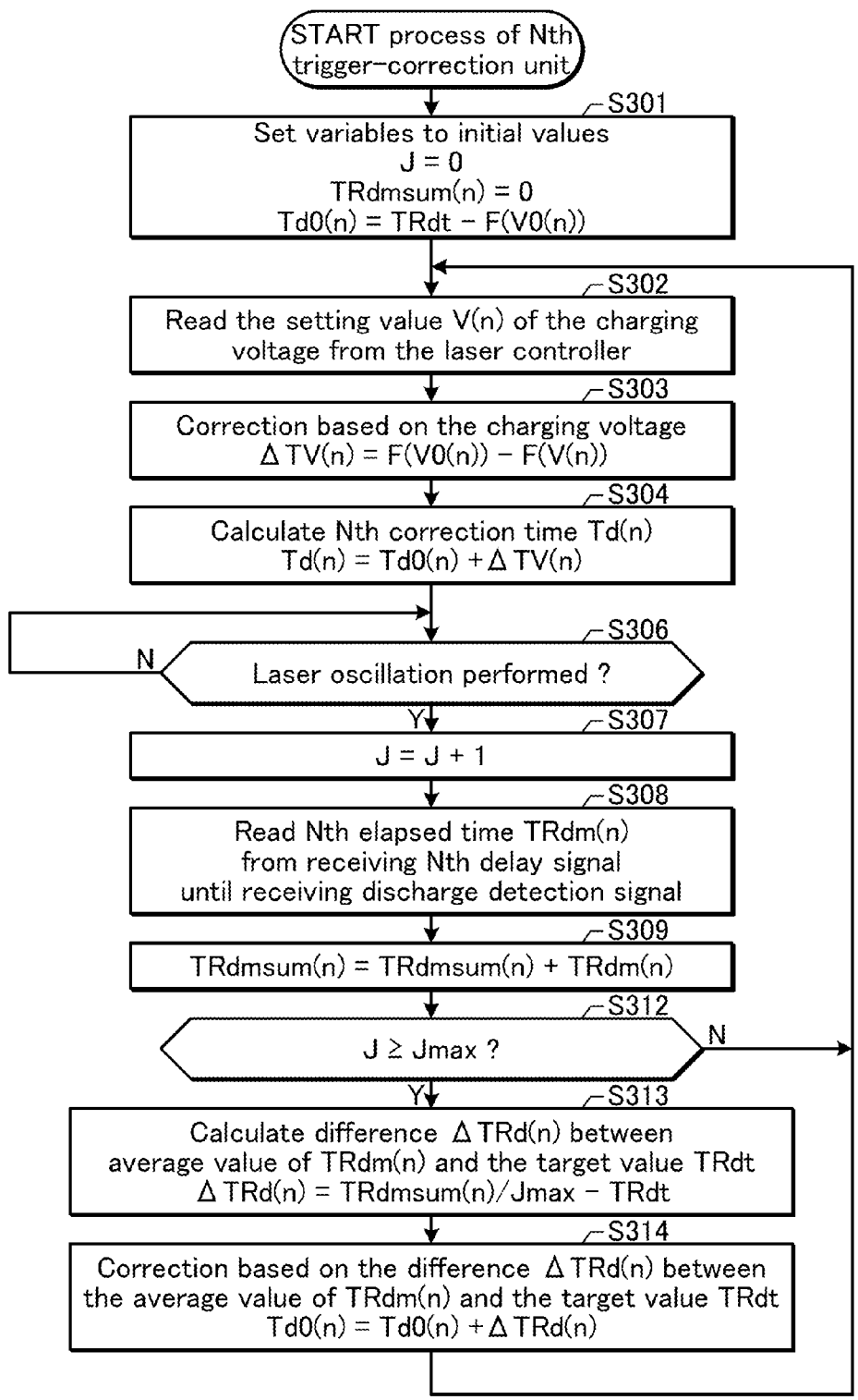
FIG. 10 is a flowchart illustrating a process of an Nth trigger-correction unit shown in FIG. 4.

FIG. 10 is a flowchart illustrating a process of the Nth trigger-correction unit shown in FIG. 4. The Nth trigger-correction unit 22n may calculate, in the processing described below, the first correction element Td0(n) and the second correction element $\Delta TV(n)$ constituting the Nth correction time Td(n).

First, at S301, the Nth trigger-correction unit 22n may set several variables to respective initial values as follows:

$$J = 0$$

$$TRdm\text{sum}(n) = 0$$

$$Td0(n) = TRdt - F(V0(n))$$

Here, J may be a counter for counting the number of pulses. TRdmsum(n) may represent a sum of the Nth elapsed time TRdm(n), from the timing at which the timer 27 receives the Nth delay signal TR(n) until the timing at which the timer 27 receives the Nth discharge detection signal DS(n), for calculating an average value of the Nth elapsed time TRdm(n). Td0(n) may represent the first correction element. TRdt-F(V0(n)) may represent the initial value of the first correction element.

Next, at S302, the Nth trigger-correction unit 22n may read the setting value V(n) of the charging voltage from the laser controller 19.

Next, at S303, the Nth trigger-correction unit 22n may calculate the second correction element $\Delta TV(n)$ based on the setting value V(n) of the charging voltage as follows.

$$\Delta TV(n) = F(V0(n)) - F(V(n))$$

Next, at S304, the Nth trigger-correction unit 22n may calculate the Nth correction time Td(n) as follows.

$$Td(n) = Td0(n) + \Delta TV(n)$$

Here, Td0(n) may represent the first correction element. ΔTV(n) may represent the second correction element.

Next, at S306, the Nth trigger-correction unit $22n$ may determine whether the Nth laser apparatus $2n$ has performed laser oscillation. Whether the Nth laser apparatus $2n$ has performed laser oscillation may be determined by whether the timer 27 receives the discharge detection signal DS(n) from the discharge sensor 18. If the Nth laser apparatus $2n$ has performed laser oscillation (S306: YES), the Nth trigger-correction unit $22n$ may proceed to S307. If the Nth laser apparatus $2n$ has not performed laser oscillation (S306: NO), the Nth trigger-correction unit $22n$ may standby until the Nth laser apparatus $2n$ performs laser oscillation.

At S307, the Nth trigger-correction unit $22n$ may add 1 to the current value of the counter J to update the value of the counter J.

Next, at S308, the Nth trigger-correction unit $22n$ may read, from the timer 27, the Nth elapsed time TRdm(n) from the timing at which the timer 27 receives the Nth delay signal TR(n) until the timing at which the timer 27 receives the Nth discharge detection signal DS(n).

Next, at S309, the Nth trigger-correction unit $22n$ may update an accumulated value TRdmsum(n) of TRdm(n) as follows.

$$TRdmsum(n)=TRdmsum(n)+TRdm(n)$$

Next, at S312, the Nth trigger-correction unit $22n$ may determine whether the value of the counter J has reached a predetermined value Jmax for the number of samples. If the value of the counter J has not reached to the predetermined value Jmax (S312: NO), the Nth trigger-correction unit $22n$ may return to the above S302. If the value of the counter J has reached the predetermined value Jmax (S312: YES), the Nth trigger-correction unit $22n$ may proceed to S313.

At S313, the Nth trigger-correction unit $22n$ may calculate the difference ΔTRd(n) between the average value TRdm(n) and the target value TRdt. The difference ΔTRd(n) may be calculated as follows.

$$\Delta TRd(n)=AVG(TRdm(n))-TRdt$$

$$=TRdmsum(n)/Jmax-TRdt$$

Next, at S314, the Nth trigger-correction unit $22n$ may update the first correction element Td0(n) as follows.

$$Td0(n)=Td0(n)-\Delta TRd(n)$$

After updating the first correction element Td0(n), the Nth trigger-correction unit $22n$ may return to the above S302.

As described above, the Nth trigger-correction unit $22n$ may calculate the Nth correction time Td(n) while updating the first correction element Td0(n) and the second correction element ΔTV(n). The second correction element ΔTV(n) may be updated at every one pulse of oscillation as described above. The first correction element Td0(n) may be updated at every Jmax pulses of oscillation as described above, where Jmax is the predetermined value for the number of samples. The predetermined value Jmax for the number of samples may, for example, be in a range of 200 to 10000. As described above, frequency of setting the Nth correction time Td(n) by updating the first correction element Td0(n) may be lower than the frequency of setting the Nth correction time Td(n) by updating the second correction element ΔTV(n).

According to the first embodiment, the Nth trigger-correction unit $22n$ may correct the Nth correction time Td(n) depending on the change in the Nth required time. The Nth elapsed time TRdm(n) may thus approach the target value TRdt. More specifically, control on the correction time based on the charging voltage of the charger 12 and control on the correction time based on the change in the Nth required time caused by the drift change may be possible. Thus, the timing of discharge in each laser apparatus may be stabilized and the pulse waveform of the bundled laser beam may be stabilized.

Setting the pulse waveform of the bundled laser beam may be achieved by the delay circuit unit 24 controlling the Nth delay time TRd(n), separately from stabilizing the pulse waveform of the bundled laser beam achieved by the Nth trigger-correction unit $22n$.

According to the first embodiment, the clock generator 23 may generate the clock signal that is common to the first to fifth trigger-correction units $22a$ to $22e$ and to the delay circuit unit 24. Error on the delay time TRd(n) or error on the correction time Td(n) may thus be reduced.

Electric wirings between the synchronous controller 22 and the laser apparatuses may have some length. Electric signals may delay by l/c, assuming the length of one of the electric wirings is l and the velocity of light is c. The delays of the electric signals may be corrected based on the lengths of the electric wirings for the switch signals S(n) from the delay circuits 26 or the discharge detection signals DS(n) from the discharge sensors 18. Optical signals through optical fibers may also delay, which may be corrected similarly to the delays of the electric signals.

In this embodiment, the control of the pulse waveform of the bundled laser beam may be achieved by the delay circuit unit 24 controlling the Nth delay time TRd(n). However, without being limited to this embodiment, the following configuration may be possible. Instead of the delay circuit unit 24, a distributor may be provided to distribute the trigger signal TR from the exposure apparatus controller 40 to the trigger-correction unit $22n$ corresponding to each of the laser apparatuses without delay. By setting separate target values TRdt(n) to the trigger-correction units $22n$, the timing of the pulse laser beam emitted from each of the laser apparatuses may be controlled.

In the above description, the laser system controller 20, the synchronous controller 22, and the laser controllers 19 of the respective laser apparatuses perform the controls of the laser apparatuses. However, the present disclosure is not limited to this. The exposure apparatus controller 40 in the exposure apparatus 4 may perform these controls.

3. Laser System Including Power Amplifier

Second Embodiment 3.1 Configuration of Laser Apparatus

Figure 11:
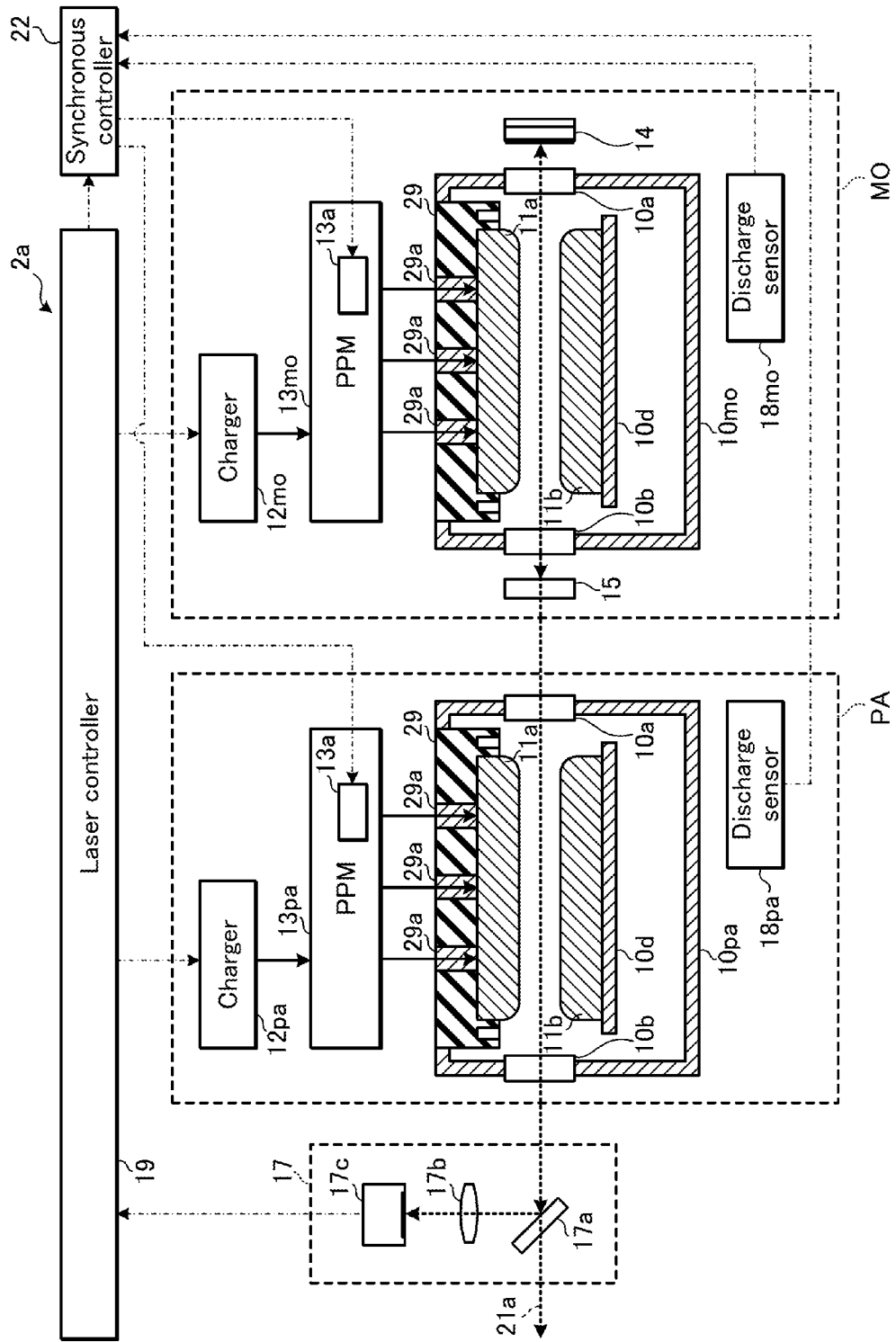
FIG. 11 shows an exemplary configuration of a laser apparatus included in a laser system according to a second embodiment of the present disclosure.

FIG. 11 shows an exemplary configuration of a laser apparatus included in a laser system according to a second embodiment of the present disclosure. The outline of the laser annealing apparatus 1 may be substantially the same as that in FIG. 1.

In the second embodiment, the first laser apparatus $2a$ may include, for example, a master oscillator MO and a power amplifier PA. Configuration of each of the second to fifth laser apparatuses $2b$ to $2e$ may be substantially the same as that of the first laser apparatus $2a$.

The master oscillator MO may include a laser chamber $10mo$, a pair of electrodes $11a$ and $11b$, a charger $12mo$, and a pulse power module $13mo$. The master oscillator MO may further include a high-reflective mirror 14, an output coupling mirror 15, and a discharge sensor $18mo$. Configurations and functions of these elements may be substantially the same as those described with reference to FIG. 2.

The power amplifier PA may be provided in the optical path of the pulse laser beam emitted from the output coupling mirror 15 of the master oscillator MO. The power amplifier PA may include, as in the master oscillator MO, a laser chamber 10*pa*, a pair of electrodes 11*a* and 11*b*, a charger 12*pa*, a pulse power module 13*pa*, and a discharge sensor 18*pa*. Configurations of these elements may be substantially the same as those in the master oscillator MO. The power amplifier PA does not have to include the high-reflective mirror 14 or the output coupling mirror 15. The pulse laser beam, which entered the power amplifier PA through the window 10*a*, may once pass the laser gain region between the electrode 11*a* and the electrode 11*b*, and then be emitted through the window 10*b*.

The laser controller 19 may control the setting value of the charging voltage of the charger 12*mo* in the master oscillator MO and the setting value of the charging voltage of the charger 12*pa* in the power amplifier PA. Controlling these charging voltages may enable controlling the pulse energy of the laser beam.

3.2 Details of Synchronous Controller

Figure 12:
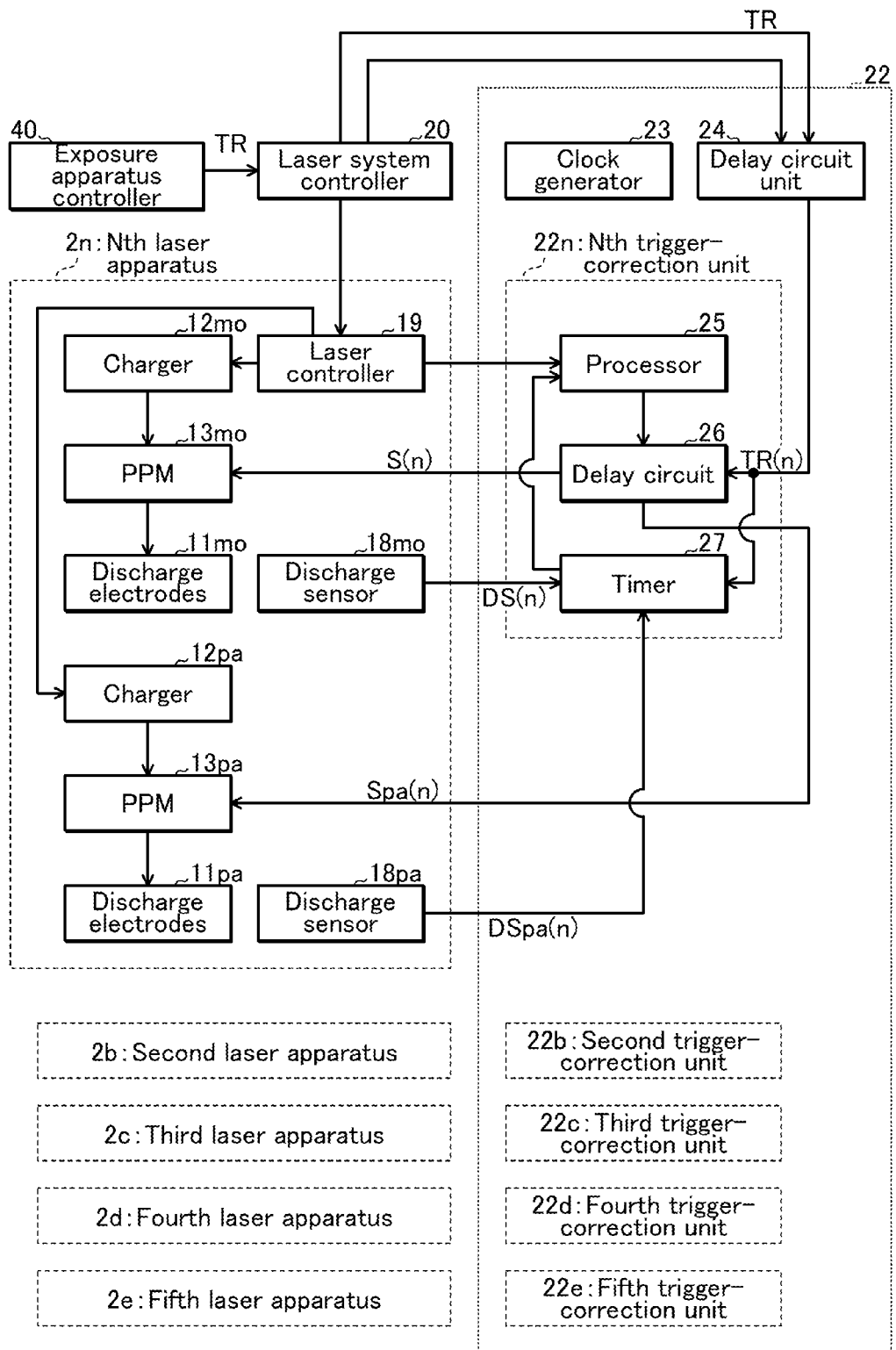
FIG. 12 is a block diagram illustrating a synchronous controller and its periphery in the second embodiment.

FIG. 12 is a block diagram illustrating a synchronous controller and its periphery in the second embodiment. In FIG. 12, configuration of the first trigger-correction unit 22*a* may be shown as that of an Nth trigger-correction unit 22*n*. Descriptions for configurations of the second to fifth trigger-correction units 22*b* to 22*e* may sometimes be omitted; however, these are substantially the same with that of the Nth trigger-correction unit 22*n*. In the second embodiment, the Nth trigger-correction unit 22*n* may set timing of the switch signal for each of the master oscillator MO and the power amplifier PA of the Nth laser apparatus 2*n*.

The delay circuit 26 of the Nth trigger-correction unit 22*n* may output the Nth switch signal S(n) to the pulse power module 13*mo* in the master oscillator MO of the Nth laser apparatus 2*n*. The Nth switch signal S (n) outputted to the master oscillator MO may be substantially the same as the Nth switch signal S(n) described in the first embodiment. The delay circuit 26 of the Nth trigger-correction unit 22*n* may output an Nth amplifier switch signal Spa(n) to the pulse power module 13*pa* of the power amplifier PA of the Nth laser apparatus 2*n*. The signal Spa(n) may be different from the Nth switch signal S(n) to be outputted to the master oscillator MO. The Nth amplifier switch signal Spa(n) to be outputted to the power amplifier PA may represent that an Nth set amount of time Tdpa(n) has passed since the Nth trigger-correction unit 22*n* received the Nth delay signal TR(n).

The laser controller 19 of the Nth laser apparatus 2*n* may receive data on the target pulse energy from the laser system controller 20. The laser controller 19 may calculate the setting value of the charging voltage based on the data on the target pulse energy. The laser controller 19 may send the setting value of the charging voltage to the chargers 12*mo* and 12*pa* and the processor 25 of the Nth trigger-correction unit 22*n*. Here, the setting value of the charging voltage sent to the charger 12*mo* and the setting value of the charging voltage sent to the charger 12*pa* may be substantially the same value. However, these setting values may be different from each other. The charger 12*mo* and the charger 12*pa* may charge the respective charge capacitors C0 in the pulse power modules 13*mo* and 13*pa* according to the respective setting values of the charging voltages. Each of the pulse power modules 13*mo* and 13*pa* may include the magnetic compression circuit described above with reference to FIG. 3.

The pulse power modules 13*mo* and 13*pa* in the Nth laser apparatus 2*n* may receive the Nth switch signal S(n) and the Nth amplifier switch signal Spa(n), respectively, outputted from the delay circuit 26. The switches 13*a* in the pulse power modules 13*mo* and 13*pa* may turn ON according to the respective switch signals. When one of the switches 13*a* turns ON, the corresponding pulse power module 13*mo* or 13*pa* may generate the pulsed high-voltage using electric energy in the corresponding charge capacitor C0. The high-voltage may be applied to the discharge electrodes 11*mo* and 11*pa*.

The discharge sensor 18*mo* of the master oscillator MO may detect electric discharge occurred between the discharge electrodes 11 of the master oscillator MO to output the discharge detection signal DS(n). The discharge sensor 18*pa* of the power amplifier PA may detect electric discharge between the discharge electrodes 11 of the power amplifier PA to output an amplifier discharge detection signal DSpa(n). The discharge detection signal DS(n) from the master oscillator MO and the amplifier discharge detection signal DSpa(n) from the power amplifier PA may be inputted to the timer 27.

The timer 27 of the Nth trigger-correction unit 22*n* may measure the Nth elapsed time TRdm(n), from the timing of receiving the Nth delay signal TR(n) until the timing of receiving the discharge detection signal DS(n) from the master oscillator MO, to send the Nth elapsed time TRdm(n) to the processor 25. The timer 27 of the Nth trigger-correction unit 22*n* may measure a time lag Dm(n), from the timing of receiving the discharge detection signal DS(n) from the master oscillator MO until the timing of receiving the amplifier discharge detection signal DSpa(n) from the power amplifier PA, to send the time lag Dm(n) to the processor 25.

The processor 25 may set the Nth correction time of the Nth switch signal S(n) based on the setting value of the charging voltage from the laser controller 19 and the Nth elapsed time TRdm(n) from the timer 27. The Nth correction time of the Nth switch signal S(n) may be outputted to the master oscillator MO.

The processor 25 may aset the Nth set amount of time Tdpa(n) of the Nth amplifier switch signal Spa(n) based on the time lag Dm(n) from the timer 27. The Nth set amount of time Tdpa(n) may be outputted to the power amplifier PA.

3.3 Timing Chart

Figure 13:
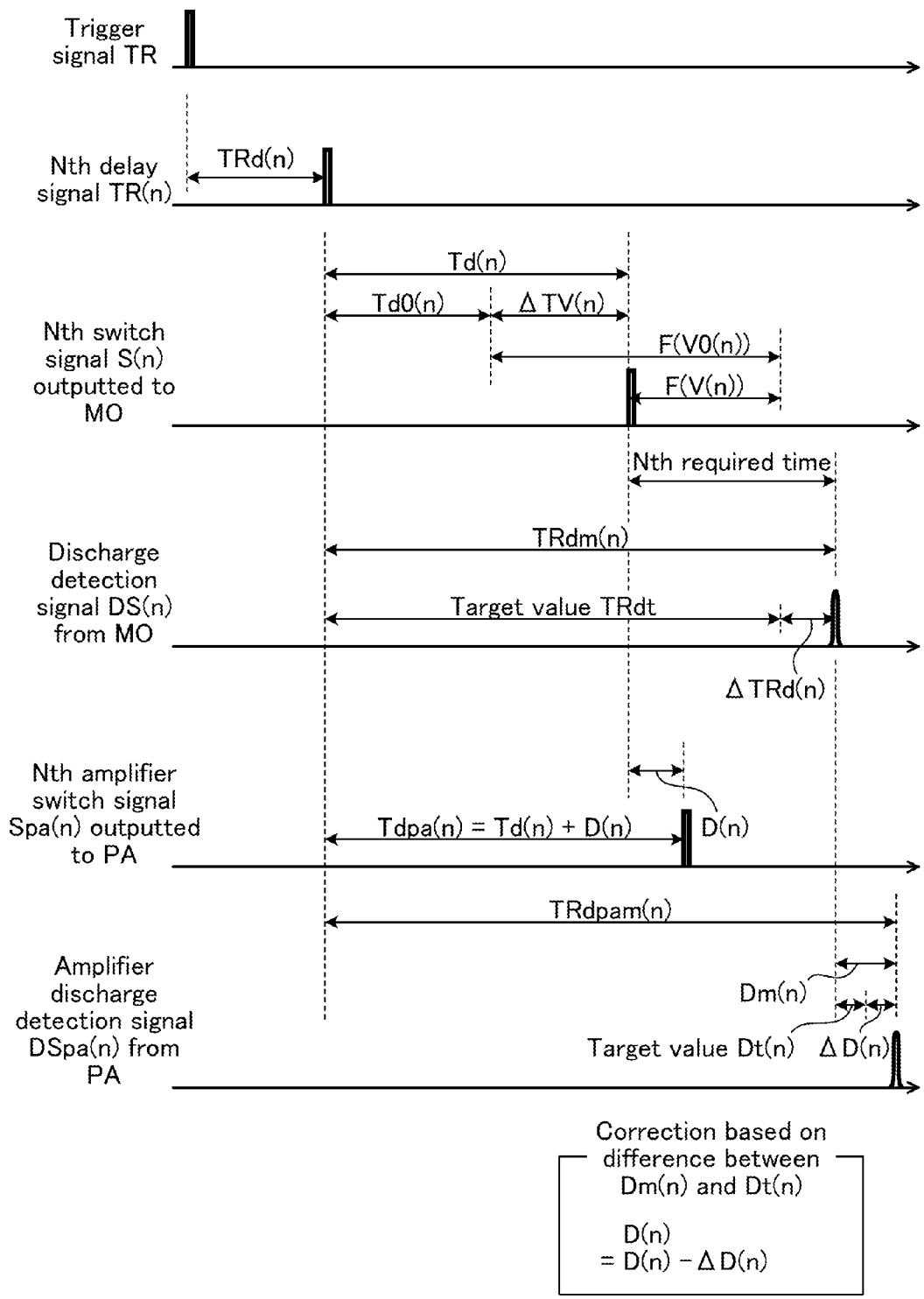
FIG. 13 is a timing chart illustrating a specific correction process in an Nth trigger-correction unit of the second embodiment.

FIG. 13 is a timing chart illustrating a specific correction process in the Nth trigger-correction unit of the second embodiment.

Control on the Nth switch signal S(n) to be outputted to the master oscillator MO may be substantially the same as that in the first embodiment described above with reference to FIG. 7.

The Nth set amount of time Tdpa(n) for the Nth amplifier switch signal Spa(n) to be outputted to the power amplifier PA may be calculated as follows.

$$Tdpa(n)=Td(n)+D(n)$$

Here, Td(n) may be the Nth correction time for the Nth switch signal S(n) to be outputted to the master oscillator MO. D(n) may be a time difference between the switch signals of the master oscillator MO and the power amplifier PA. In other words, D(n) may be the time difference from the output timing of the Nth switch signal S(n) to be outputted to the master oscillator MO until the output timing of the Nth amplifier switch signal Spa(n) to be outputted to the power amplifier PA.

The timer 27 in the Nth trigger-correction unit 22n may output the time lag Dm(n), from the timing of receiving the discharge detection signal DS(n) from the master oscillator MO until the timing of receiving the amplifier discharge detection signal DSpa(n) from the power amplifier PA, to the processor 25.

The processor 25 of the Nth trigger-correction unit 22n may, upon receiving the time lag Dm(n) from the timer 27, calculate difference ΔD(n) between the time lag Dm(n) and its target value Dt(n). The difference ΔD(n) may be calculated as follows.

$$\Delta D(n)=\text{AVG}(Dm(n))-Dt(n)$$

AVG(Dm(n)) may be an average value of the time lag Dm(n) measured for multiple times.

Each of the target values Dt(n) of the time lags Dm(n) in the first to fifth trigger-correction units 22a to 22e may be different from each other. The target value Dt(n) may be set to achieve high efficiency of amplification in each of the power amplifiers PA.

The time difference D(n) between the switch signal of the master oscillator MO and the switch signal of the power amplifier PA may be updated based on the difference ΔD(n) as follows.

$$D(n)=D(n)-\Delta D(n)$$

The time difference D(n) between the switch signal of the master oscillator MO and the switch signal of the power amplifier PA may be updated as described above based on the difference ΔD(n) between the time lag Dm(n) and its target value Dt(n). This enables accurate timing control of the Nth amplifier switch signal Spa(n) to be outputted to the power amplifier PA.

3.4 Processing of Nth Trigger-Correction Unit

Figure 14A:
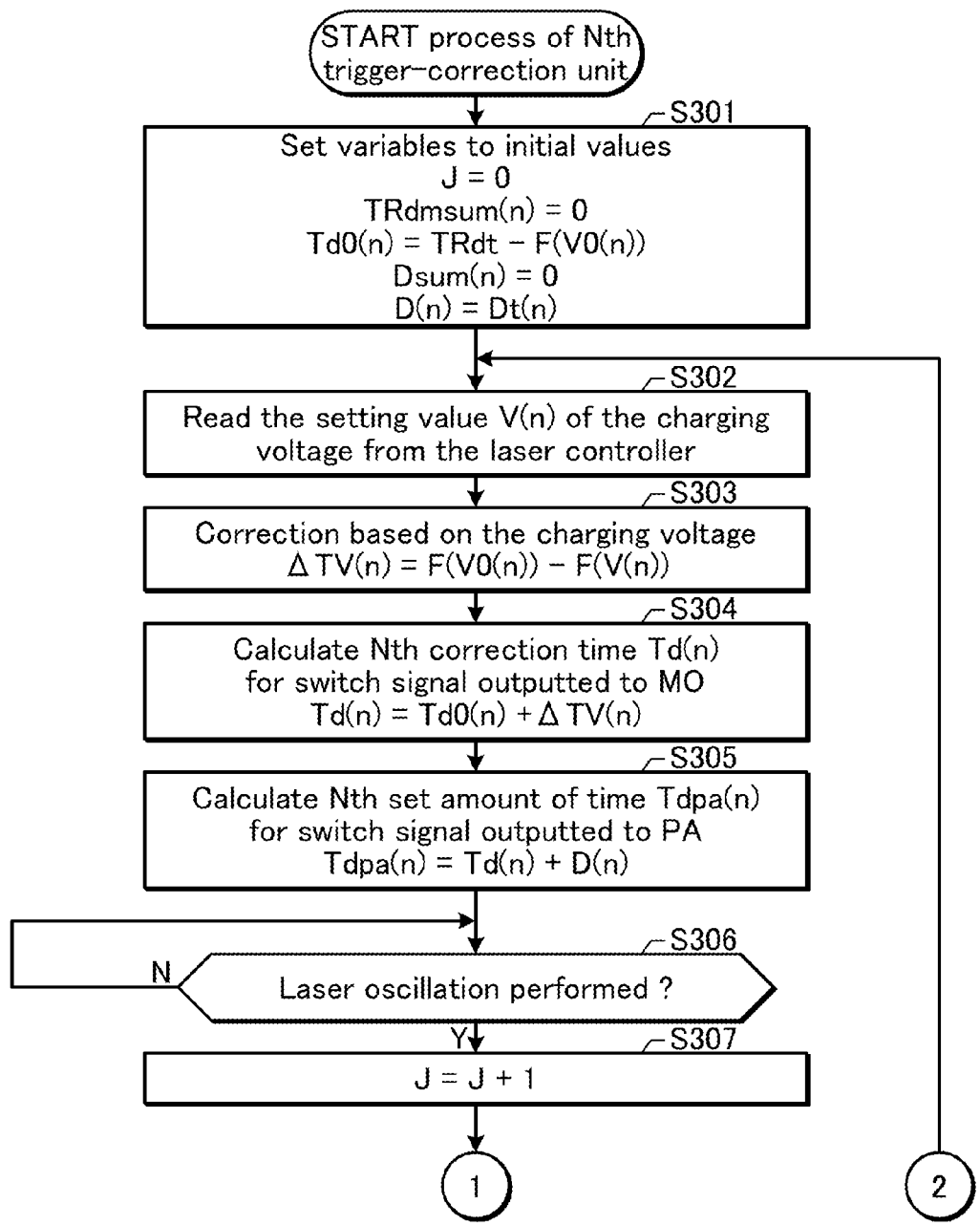
FIGS. 14A and 14B are flowcharts illustrating a process of the Nth trigger-correction unit according to the second embodiment.
Figure 14B:
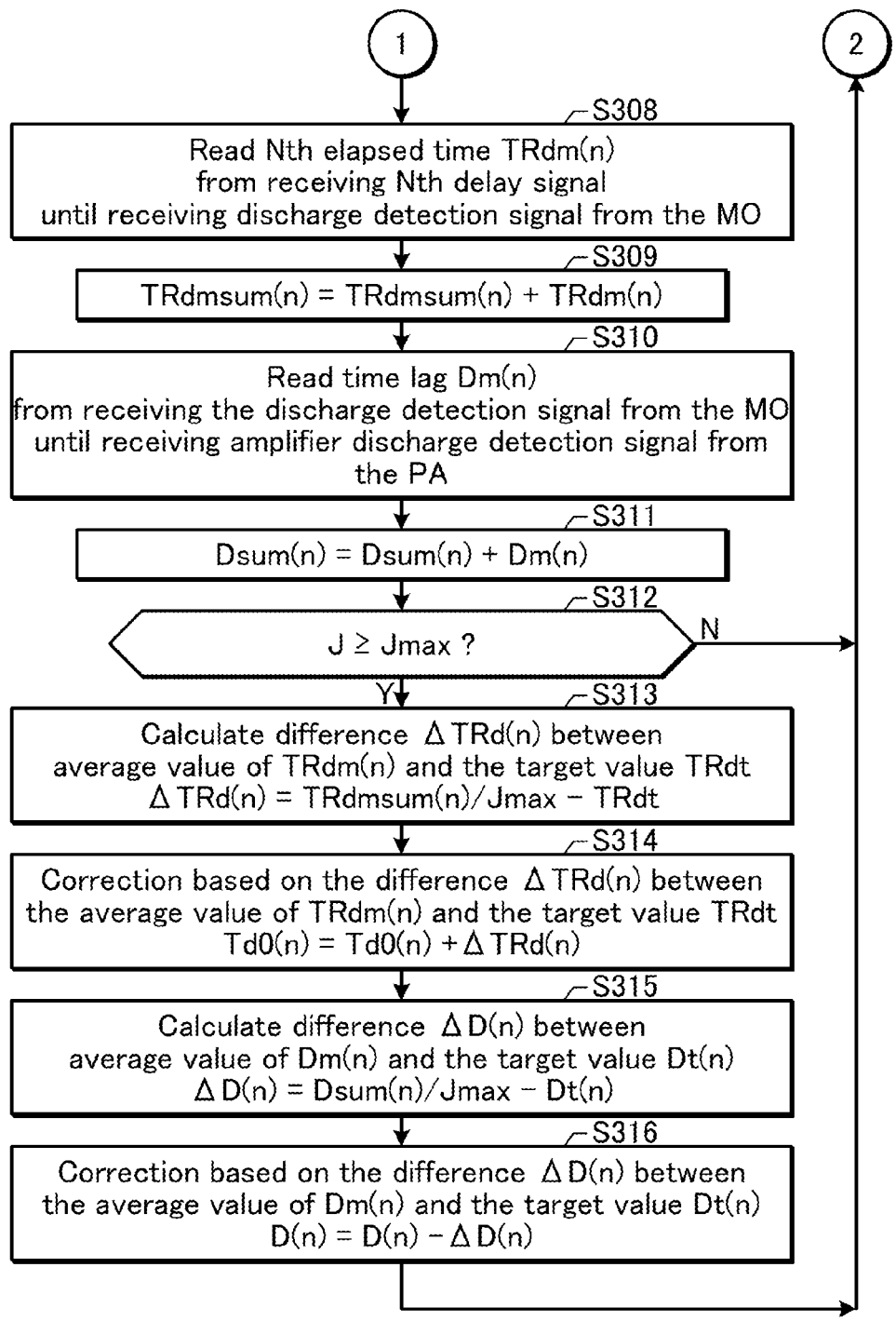

FIGS. 14A and 14B are flowcharts illustrating a process of the Nth trigger-correction unit according to the second embodiment. The Nth trigger-correction unit 22n may, through the processing described below, calculate the Nth correction time Td(n) of the Nth switch signal S(n) to be outputted to the master oscillator MO, and calculate the time difference D(n) between the switch signals of the master oscillator MO and the power amplifier PA.

At S301 of FIG. 14A, the Nth trigger-correction unit 22n may set several variables to initial values as follows:

$$J=0$$

$$TRdm\text{sum}(n)=0$$

$$Td0(n)=TRdt-F(V0(n))$$

$$D\text{sum}(n)=0$$

$$D(n)=Dt(n)$$

Here, J, TRdmsum(n), and Td0(n) may be substantially the same as those described in the first embodiment.

Dsum(n) may be an accumulated value of the time lag Dm(n). The accumulated value may be calculated for calculating an average value of the time lag Dm(n). The time lag Dm(n) may be a time period from the timing at which the timer 27 receives the discharge detection signal DS(n) from the master oscillator MO until the timing at which the timer 27 receives the amplifier discharge detection signal DSpa(n) from the power amplifier PA.

D(n) may be the time difference between the switch signals of the master oscillator MO and the power amplifier PA. Dt(n) may be the target value of the time lag Dm(n).

The next processes at S302 and S303 may be substantially the same as the corresponding processes in the first embodiment.

Next, at S304, the Nth trigger-correction unit 22n may calculate the Nth correction time Td(n) of the Nth switch signal S(n) to be outputted to the master oscillator MO as follows.

$$Td(n)=Td0(n)+\Delta TV(n)$$

This process may also be substantially the same as that in the first embodiment.

Next, at S305, the Nth trigger-correction unit 22n may calculate the Nth set amount of time Tdpa(n) for the Nth amplifier switch signal Spa(n) to be outputted to the power amplifier PA as follows.

$$Tdpa(n)=Td(n)+D(n)$$

Next, at S306, the Nth trigger-correction unit 22n may determine whether the Nth laser apparatus 2n has performed laser oscillation. If the Nth laser apparatus 2n has performed laser oscillation (S306: YES), the Nth trigger-correction unit 22n may add 1 to the current value of the counter J to update the value of the counter J at S307. These processes may be substantially the same as the corresponding processes in the first embodiment.

Next, at S308 of FIG. 14B, the Nth trigger-correction unit 22n may read the Nth elapsed time TRdm(n), from the timing at which the timer 27 receives the Nth delay signal TR(n) until the timing at which the timer 27 receives the discharge detection signal DS(n) from the master oscillator MO, from the timer 27.

Next, at S309, the Nth trigger-correction unit 22n may update the accumulated value TRdmsum(n) of TRdm(n) as follows.

$$TRdm\text{sum}(n)=TRdm\text{sum}(n)+TRdm(n)$$

These processing may also be substantially the same as those in the first embodiment.

Next, at S310, the Nth trigger-correction unit 22n may read the time lag Dm(n), from the timing at which the timer 27 receives the discharge detection signal DS(n) from the master oscillator MO until the timing at which the timer 27 receives the amplifier discharge detection signal DSpa(n) from the power amplifier PA, from the timer 27.

Next, at S311, the Nth trigger-correction unit 22n may update the accumulated value Dsum(n) of the time lag Dm(n) as follows.

$$D\text{sum}(n)=D\text{sum}(n)+Dm(n)$$

Next, at S312, the Nth trigger-correction unit 22n may determine whether the value of the counter J has reached a predetermined value Jmax for the number of samples. If the value of the counter J has not reached the predetermined value Jmax (S312: NO), the Nth trigger-correction unit 22n may return to the above S302. If the value of the counter J has reached the predetermined value Jmax (S312: YES), the Nth trigger-correction unit 22n may proceed to S313.

The process at S313 and the next process at S314 may be substantially the same as the corresponding processes in the first embodiment.

Next, at S315, the Nth trigger-correction unit 22n may calculate the difference ΔD(n) between the average value of the time lag Dm(n) and its target value Dt(n). The difference ΔD(n) may be calculated as follows.

ΔD(n)=AVG(Dm(n))−Dt(n)

=Dsum(n)/Jmax−Dt(n)

Next, at S316, the Nth trigger-correction unit 22*n* may update the time difference D(n) between the switch signals of the master oscillator MO and the power amplifier PA as follows.

D(n)=D(n)−ΔD(n)

After updating the time difference D(n) between the switch signals of the master oscillator MD and the power amplifier PA, the Nth trigger-correction unit 22*n* may return to the above S302.

As described above, the Nth trigger-correction unit 22*n* may calculate the Nth correction time Td(n) of the Nth switch signal S(n) to be outputted to the master oscillator MO, and calculate the time difference D(n) between the switch signals of the master oscillator MO and the power amplifier PA.

According to the second embodiment, appropriate timing control may be achieved in the case where the laser apparatus includes the master oscillator MO and the power amplifier PA. Consequently, the timing of discharge in each laser apparatus may be stabilized, and the pulse waveform of the bundled laser beam may be stabilized.

In other aspects, this embodiment may be substantially the same as the first embodiment. The present disclosure may not be limited to the case where a single laser apparatus include a single master oscillator MO and a single power amplifier PA. A single laser apparatus may include a single master oscillator MD and a plurality of power amplifiers PA.

4. Laser System, Each Laser Apparatus Including Trigger-Correction Unit

4.1 Third Embodiment

Figure 15:
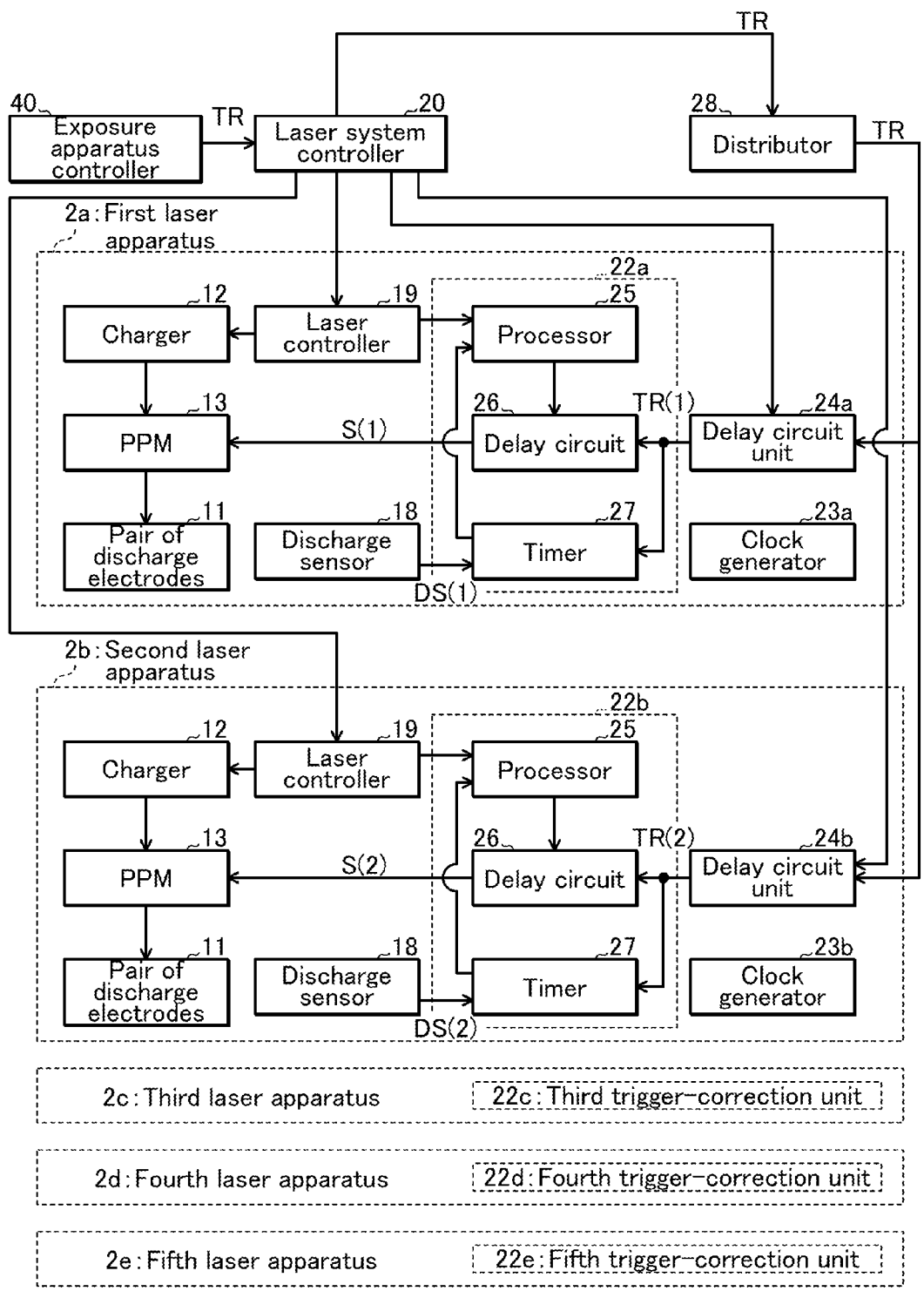
FIG. 15 is a block diagram illustrating a configuration of a laser system according to a third embodiment of the present disclosure.

FIG. 15 is a block diagram illustrating a configuration of a laser system according to a third embodiment of the present disclosure. In the third embodiment, the first to fifth trigger-correction units 22*a* to 22*e* may be included in the first to fifth laser apparatuses 2*a* to 2*e*, respectively. The laser system 5 may include a distributor 28, instead of the synchronous controller 22. Clock generators 23*a* to 23*e* may be included in the first to fifth laser apparatuses 2*a* to 2*e*, respectively, instead of the clock generator 23 included in the synchronous controller 22. Illustrations of the clock generators 23*c* to 23*e* are omitted. Delay circuit units 24*a* to 24*e* may be included in the first to fifth laser apparatuses 2*a* to 2*e*, respectively, instead of the delay circuit unit 24 included in the synchronous controller 22. Illustrations of the delay circuit units 24*c* to 24*e* are omitted.

The delay circuit units 24*a* to 24*e* included in the first to fifth laser apparatuses 2*a* to 2*e* may receive data on the delay times TRd(1) to TRd(5) of the first to fifth delay signals TR(1) to TR(5), respectively, from the laser system controller 20.

The distributor 28 may receive the trigger signal TR from the laser system controller 20. The distributor 28 may send the trigger signal TR to the delay circuit units 24*a* to 24*e* included in the first to fifth laser apparatuses 2*a* to 2*e*, respectively. The delay circuit units 24*a* to 24*e* may output the first to fifth delay signals TR(1) to TR(5) to the first to fifth trigger-correction units 22*a* to 22*e*, respectively. The clock generators 23*a* to 23*e* in the first to fifth laser apparatuses 2*a* to 2*e*, respectively, may generate the clock signals. In each of the first to fifth laser apparatuses 2*a* to 2*e*, the clock signal may be common to the trigger-correction unit and the delay circuit unit.

In other aspects, this embodiment may be substantially the same as the first embodiment.

In the third embodiment, the trigger-correction units 22*a* to 22*e* and the delay circuit units 24*a* to 24*e* are included in the respective laser apparatuses. This may shorten lengths of the electric wirings between the respective trigger-correction units 22*a* to 22*e* and the respective pulse power modules 13, suppressing delay of signals running through the electric wirings.

In the third embodiment, the trigger-correction units 22*a* to 22*e* and the delay circuit units 24*a* to 24*e* are included in the respective laser apparatuses. However, the present disclosure may not be limited to this. For example, the delay circuit units 24*a* to 24*e* may be omitted and different target values TRdt(n) may be set to the trigger-correction units 22*a* to 22*e* to control the timings of the pulse laser beams emitted from the respective laser apparatuses.

4.2 Fourth Embodiment

Figure 16:
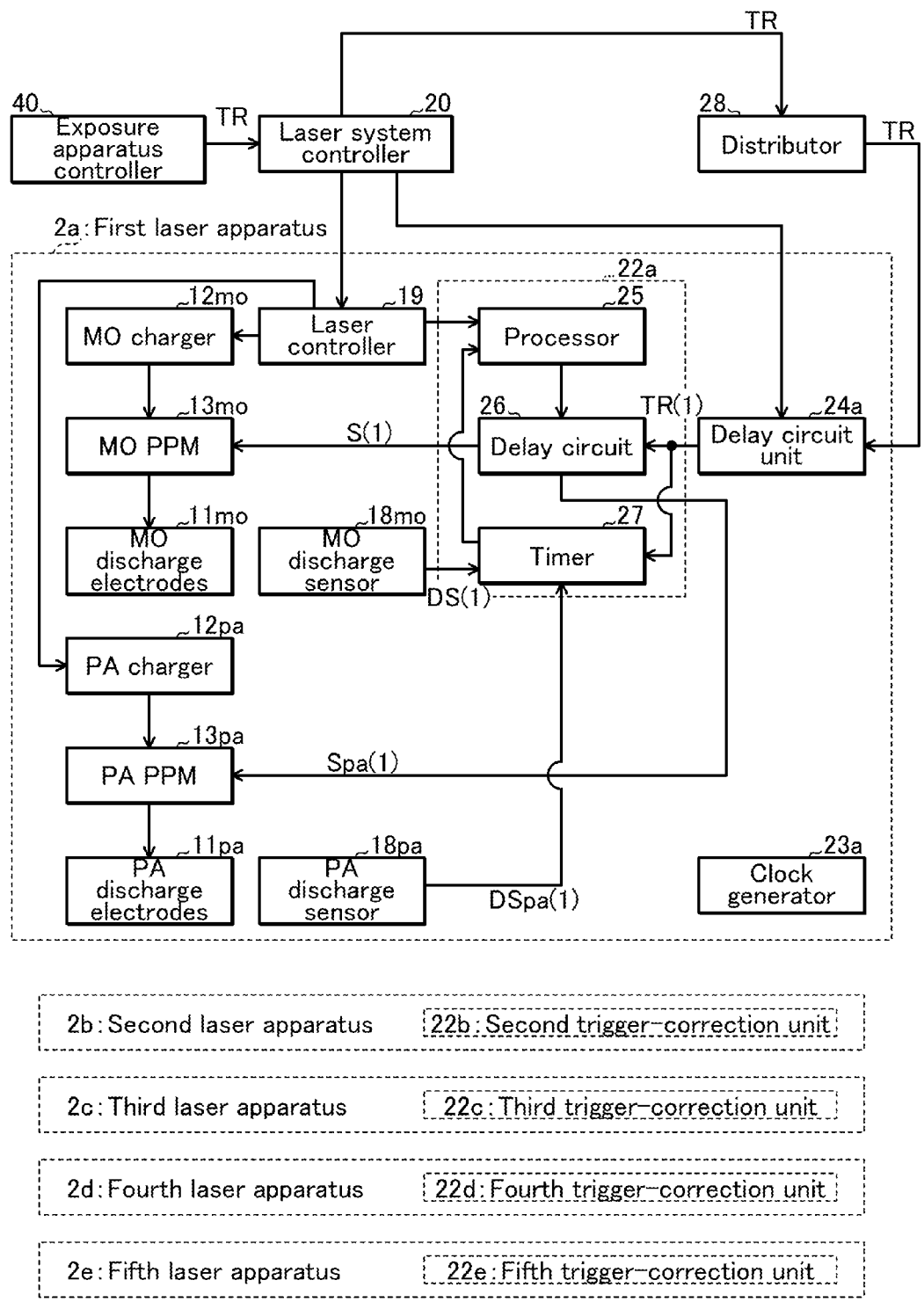
FIG. 16 is a block diagram illustrating a configuration of a laser system according to a fourth embodiment of the present disclosure.

FIG. 16 is a block diagram illustrating a configuration of a laser system according to a fourth embodiment of the present disclosure. In the fourth embodiment, the first to fifth trigger-correction units 22*a* to 22*e* may be included in the first to fifth laser apparatuses 2*a* to 2*e*, respectively. The laser system 5 may include a distributor 28 instead of the synchronous controller 22. Instead of the clock generator 23 in the synchronous controller 22, clock generators 23*a* to 23*e* may be included in the first to fifth laser apparatuses 2*a* to 2*e*, respectively. Illustration of the clock generators 23*b* to 23*e* is omitted. Instead of the delay circuit unit 24 in the synchronous controller 22, delay circuit units 24*a* to 24*e* may be included in the first to fifth laser apparatuses 2*a* to 2*e*, respectively. Illustration of the delay circuit units 24*b* to 24*e* is omitted.

The delay circuit units 24*a* to 24*e* in the first to fifth laser apparatuses 2*a* to 2*e* may receive data on the delay times TRd(1) to TRd(5) of the first to fifth delay signals TR(1) to TR(5), respectively, from the laser system controller 20.

The distributor 28 may receive the trigger signal TR from the laser system controller 20. The distributor 28 may send the trigger signal TR to the respective delay circuit units 24*a* to 24*e* in the first to fifth laser apparatuses 2*a* to 2*e*. The delay circuit units 24*a* to 24*e* may send the first to fifth delay signals TR(1) to TR(5) to the first to fifth trigger-correction units 22*a* to 22*e*, respectively. The clock generators 23*a* to 23*e* in the first to fifth laser apparatuses 2*a* to 2*e* may generate the respective clock signals. In each of the first to fifth laser apparatuses 2*a* to 2*e*, the clock signal may be common to the trigger-correction unit and the delay circuit unit.

In other aspects, this embodiment may be substantially the same as the second embodiment.

In the fourth embodiment, the trigger-correction units 22*a* to 22*e* and the delay circuit units 24*a* to 24*e* are included in the respective laser apparatuses as described in the third embodiment. This may shorten lengths of the electric wirings between the respective trigger-correction units 22*a* to 22*e* and the respective pulse power modules 13, suppressing delay of signals running through the electric wirings.

In the fourth embodiment, the trigger-correction units 22*a* to 22*e* and the delay circuit units 24*a* to 24*e* are included in the respective laser apparatuses. However, the present disclosure may not be limited to this. For example, the delay circuit units 24a to 24e may be omitted and different target values TRdt(n) may be set to the trigger-correction units 22a to 22e to control the timings of the pulse laser beams emitted from the respective laser apparatuses.

5. Laser System Including Pulse Waveform Measuring Device

Fifth Embodiment

5.1 Configuration

Figure 17:
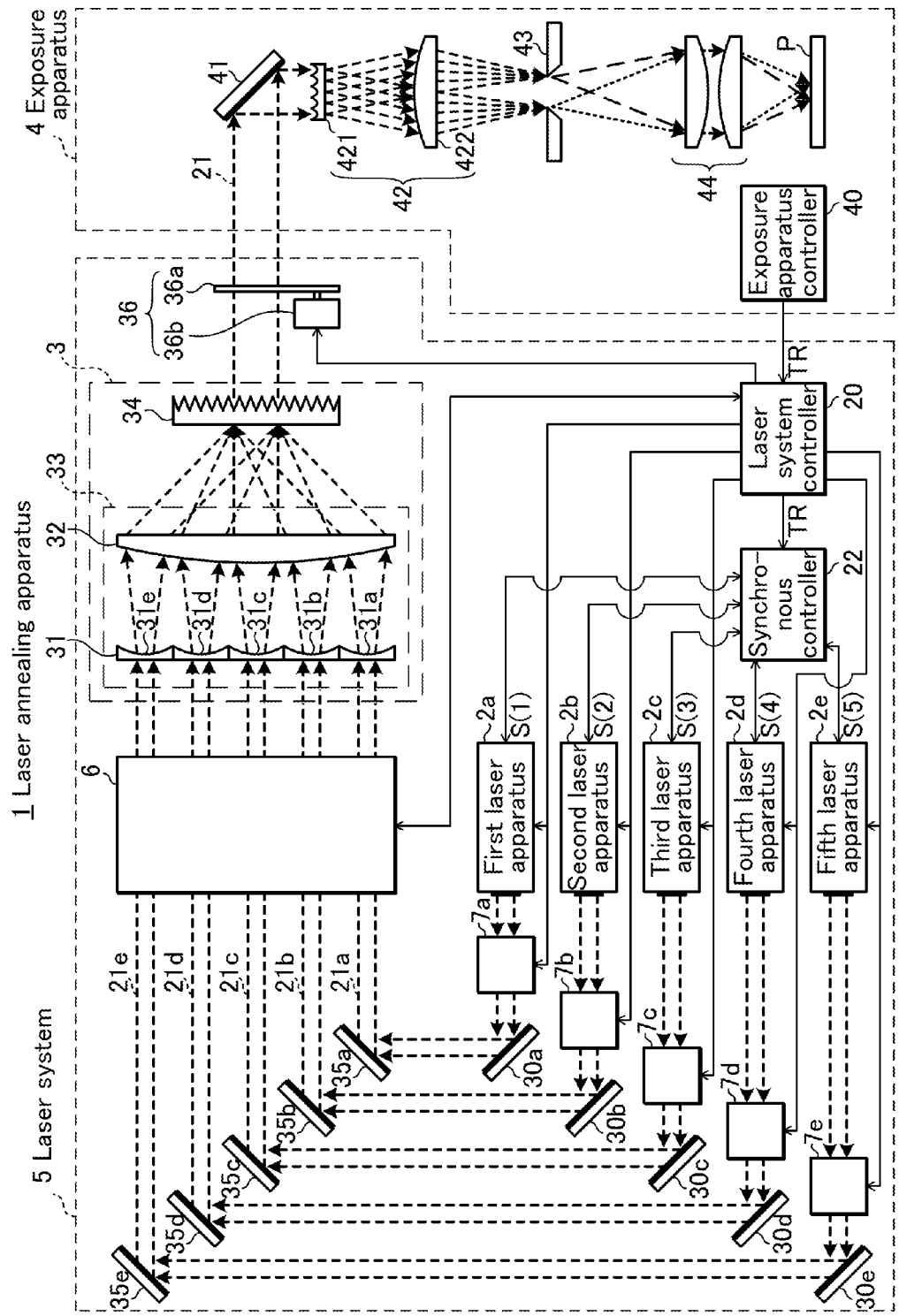
FIG. 17 schematically shows a configuration of a laser annealing apparatus 1 including a laser system 5 according to a fifth embodiment of the present disclosure.

FIG. 17 schematically shows a configuration of a laser annealing apparatus 1 including a laser system 5 according to a fifth embodiment of the present disclosure. In the fifth embodiment, the laser system 5 may include a pulse waveform measuring device 6 and a shutter 36.

The pulse waveform measuring device 6 may extend over the cross sections of the optical paths of the first to fifth pulse laser beams 21a to 21e, at a position between the light-emitting positions of the first to fifth laser apparatuses 2a to 2e and the beam bundling device 3. The first to fifth pulse laser beams 21a to 21e entering the pulse waveform measuring device 6 may be substantially parallel to each other.

The shutter 36 may be provided closely to the optical path of the bundled laser beam 21 emitted from the beam bundling device 3. The shutter 36 may include a shielding plate 36a and an actuator 36b. The actuator 36b may put the shielding plate 36a in the optical path of the bundled laser beam 21 or put it out from the optical path.

In other aspects, this embodiment may be substantially the same as the third embodiment or the fourth embodiment.

5.2 Pulse Waveform Measuring Device

Figure 18:
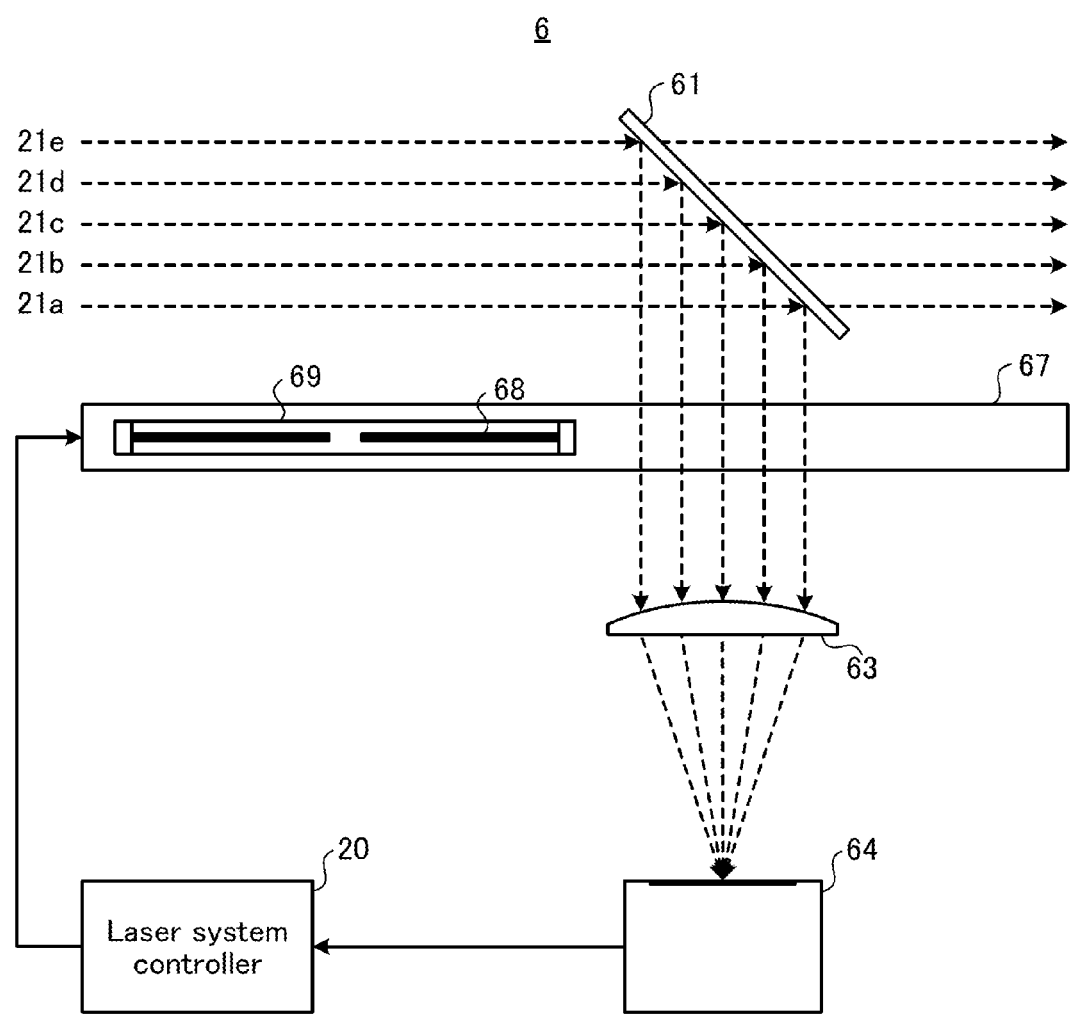
FIG. 18 shows a specific configuration of a pulse waveform measuring device 6 shown in FIG. 17.

FIG. 18 shows a specific configuration of the pulse waveform measuring device 6 shown in FIG. 17.

The pulse waveform measuring device 6 may include a beam splitter 61, focusing optics 63, an optical sensor 64, and a beam selecting mechanism 67.

The beam splitter 61 may extend over the cross sections of the optical paths of the first to fifth pulse laser beams 21a to 21e. The beam splitter 61 may transmit a part of each of the first to fifth pulse laser beams 21a to 21e at high transmittance, and reflect another part of each of the first to fifth pulse laser beams 21a to 21e.

The beam selecting mechanism 67 may include a slit plate 68 and a moving mechanism 69. The beam selecting mechanism 67 may extend over cross sections of the optical paths of the first to fifth pulse laser beams 21a to 21e reflected by the beam splitter 61. The moving mechanism 69 may move the slit plate 68 across the optical path axes of the first to fifth pulse laser beams 21a to 21e. The slit plate 68 may have a slit through which a single pulse laser beam of the first to fifth pulse laser beams 21a to 21e may pass. The moving mechanism 69 may control the position of the slit plate 68 such that all of the first to fifth pulse laser beams 21a to 21e or a selected single pulse laser beam of the first to fifth pulse laser beams 21a to 21e may pass through the beam selecting mechanism 67.

The focusing optics 63 may concentrate all or each of the first to fifth pulse laser beams 21a to 21e, emitted from the beam selecting mechanism 67, to a light-receiving surface of the optical sensor 64.

The optical sensor 64 may be provided at the focal plane of the focusing optics 63. The optical sensor 64 may be a high-responsive photodiode or a high-responsive photoelectric tube. The optical sensor 64 may receive all or each of the first to fifth pulse laser beams 21a to 21e concentrated by the focusing optics 63. The optical sensor 64 may output data on the pulse waveform or on the passage timing of all or each of the first to fifth pulse laser beams 21a to 21e to the laser system controller 20. The data for the all of the first to fifth pulse laser beams 21a to 21e may be used as data for the bundled laser beam.

5.3 Controlling Operation

Figure 19:
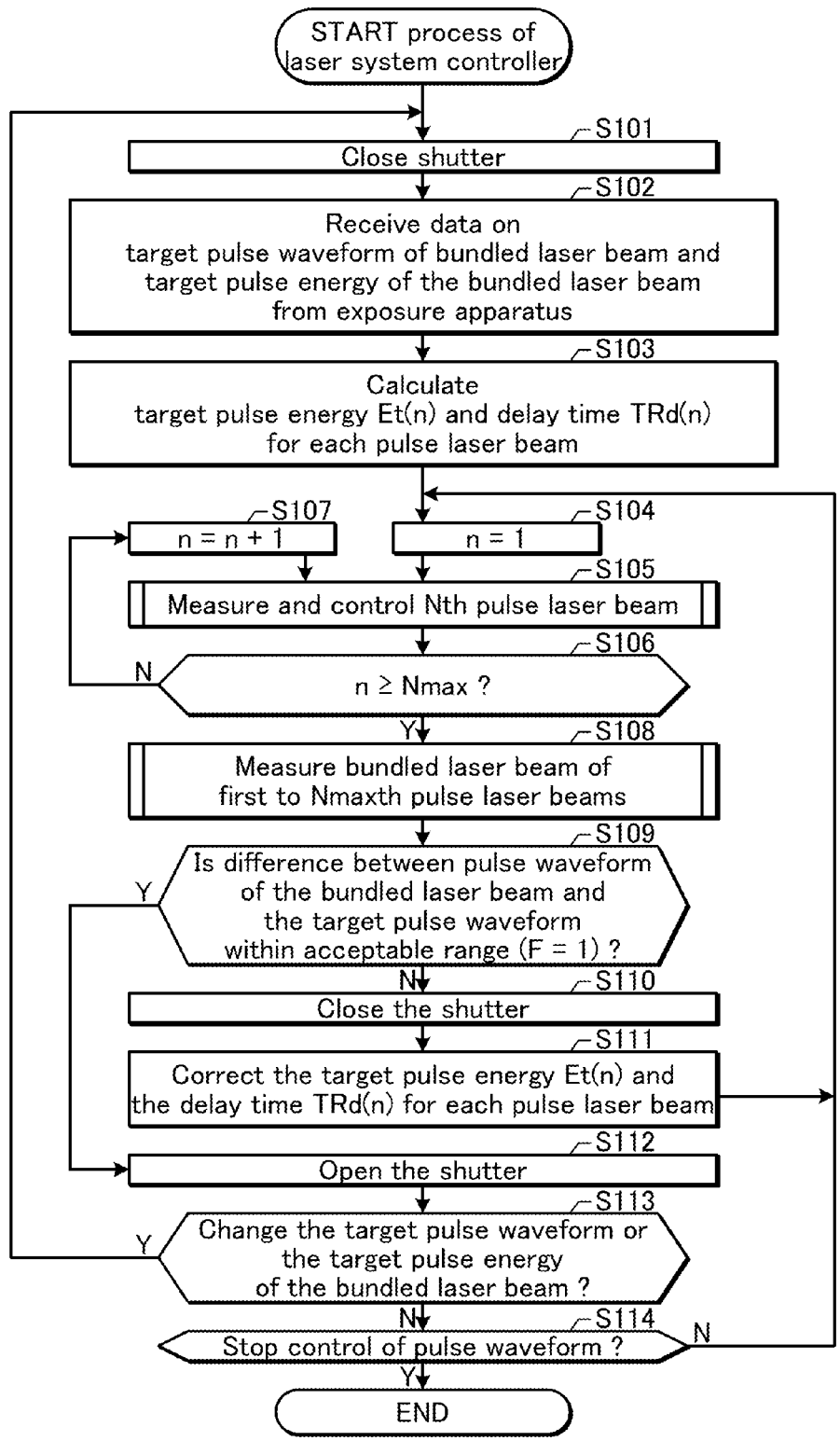
FIG. 19 is a flowchart illustrating a process of the laser system controller 20 shown in FIG. 17.

FIG. 19 is a flowchart illustrating a process of the laser system controller 20 shown in FIG. 17. In the following description, Nmax may be the number of the laser apparatuses included in the laser system 5. The laser system controller 20 may correct, based on the pulse energy and on the passage timing of each of the first to Nmaxth pulse laser beams, the target pulse energy Et(n) and the Nth delay time TRd(n) for each of the pulse laser beams. The laser system controller 20 may correct, based on the pulse waveform of the bundled laser beam of the first to Nmaxth pulse laser beams, the target pulse energy Et(n) and the Nth delay time TRd(n) for each of the pulse laser beams.

First, at S101, the laser system controller 20 may close the shutter 36 and stop emitting the bundled laser beam 21 to the exposure apparatus 4.

Next, at S102, the laser system controller 20 may receive data on the target pulse waveform of the bundled laser beam 21 and the target pulse energy of the bundled laser beam 21 from the exposure apparatus controller 40 of the exposure apparatus 4. This process may be substantially the same as the process described above with reference to FIG. 8.

Next, at S103, the laser system controller 20 may calculate the target pulse energy Et(n) and the Nth delay time TRd(n) for Nth pulse laser beam 21n. This process may be substantially the same as the process described above with reference to FIG. 8.

Next, at S104, the laser system controller 20 may set the value of N to 1.

Next, at S105, the laser system controller 20 may perform measurement and control of the Nth pulse laser beam 21n. For example, if the value of N is 1, the laser system controller 20 may perform measurement and control of the first pulse laser beam 21a. Details of the process in S105 will be described below in reference to FIG. 20.

Next, at S106, the laser system controller 20 may determine whether the value of N has reached Nmax. If the value of N has not reached Nmax (S106: NO), the laser system controller 20 may add 1 to the value of N to update the value of N at S107 and then return to the above-mentioned S105. If the value of N has reached Nmax (S106: YES), the laser system controller 20 may proceed to S108.

At S108, the laser system controller 20 may measure the pulse waveform of the bundled laser beam of the first to Nmaxth pulse laser beams. Details of the process in S108 will be described below in reference to FIG. 21.

Next, at S109, the laser system controller 20 may determine whether difference between the pulse waveform of the bundled laser beam of the first to Nmaxth pulse laser beams and the target pulse waveform of the bundled laser beam is within an acceptable range. If the difference is not within the acceptable range (S109: NO), the laser system controller 20 may proceed to S110. If the difference is within the acceptable range (S109: YES), the laser system controller 20 may proceed to S112.

At S110, the laser system controller 20 may close the shutter 36 and stop emitting the bundled laser beam 21 to the exposure apparatus 4. If the shutter 36 has been closed, S110 may be skipped. Next, at S111, the laser system controller 20 may correct the target pulse energy Et(n) and the Nth delay time TRd(n) for the Nth pulse laser beam 21n. For example, the target pulse energy Et(n) and the Nth delay time TRd(n) may be corrected based on data on the pulse laser beam measured at S105. The target pulse energy Et(n) and the Nth delay time TRd(n) may be corrected such that the pulse waveform of the bundled laser beam of the first to Nmaxth pulse laser beams approaches the target pulse waveform. After S111, the laser system controller 20 may return to the above S104 to repeat the measurement of each pulse laser beam.

At S112, the laser system controller 20 may open the shutter 36 to start emitting the bundled laser beam 21 to the exposure apparatus 4.

Next, at S113, the laser system controller 20 may determine whether the target pulse waveform of the bundled laser beam 21 and the target pulse energy of the bundled laser beam 21 should be changed. If the target pulse waveform or the target pulse energy should be changed (S113: YES), the laser system controller 20 may return to the above S101. If the target pulse waveform or the target pulse energy should not be changed (S113: NO), the laser system controller 20 may proceed to S114.

Next, at S114, the laser system controller 20 may determine whether the control on the pulse waveform should be stopped. If the control on the pulse waveform should not be stopped (S114: NO), the laser system controller 20 may return to the above S104. If the control on the pulse waveform should be stopped (S114: YES), the laser system controller 20 may terminate the processing of this flowchart.

Figure 20:
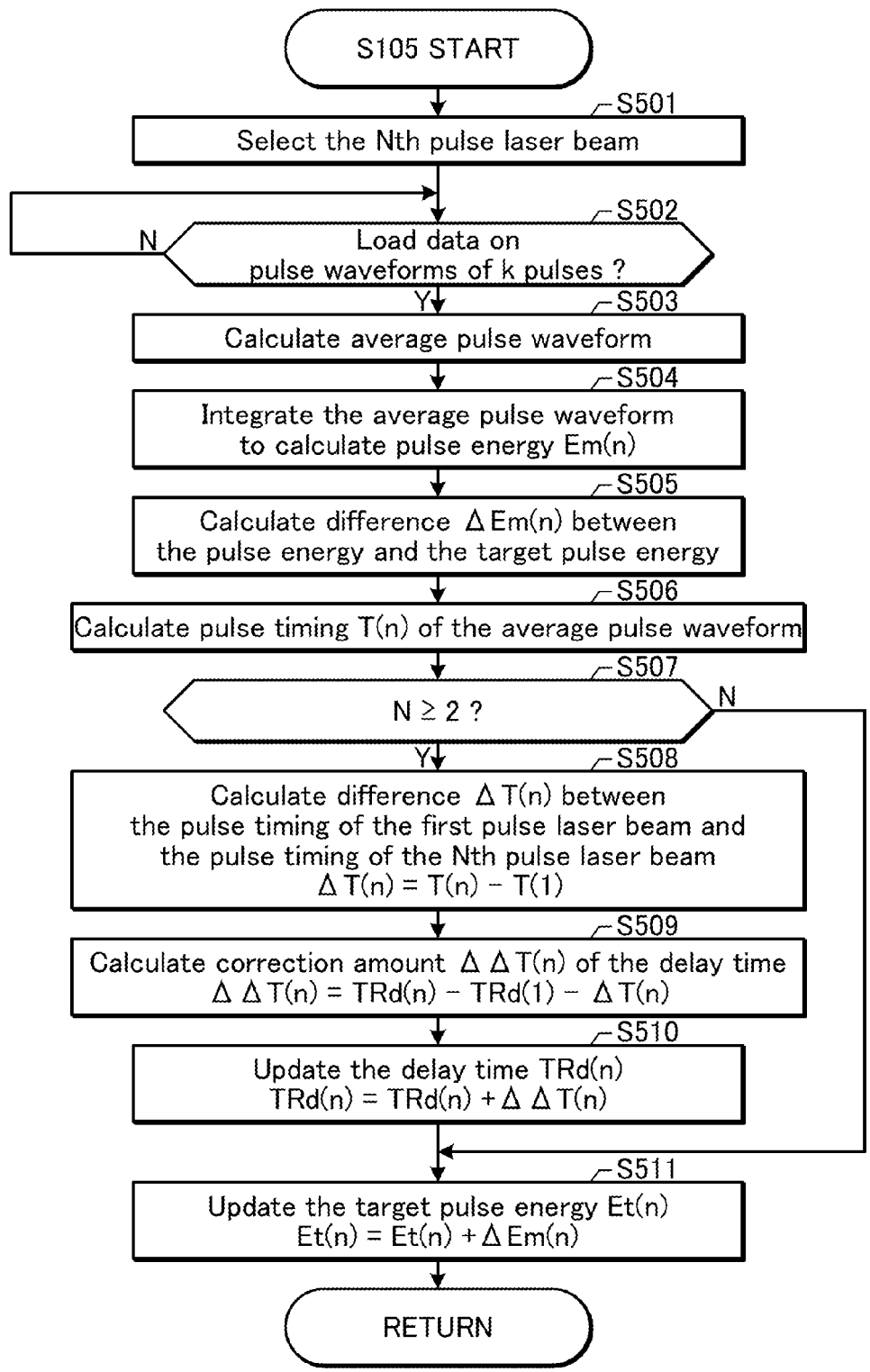
FIG. 20 is a flowchart illustrating a detailed process of measuring and controlling an Nth pulse laser beam shown in FIG. 19.

FIG. 20 is a flowchart illustrating a detailed process of measuring and controlling the Nth pulse laser beam shown in FIG. 19. The processing shown in FIG. 20 may be performed by the laser system controller 20 as a subroutine of S105 shown in FIG. 19.

First, at S501, the laser system controller 20 may control the beam selecting mechanism 67 of the pulse waveform measuring device 6 to select the Nth pulse laser beam. This may allow the pulse waveform measuring device 6 to start measuring the pulse waveform of the Nth pulse laser beam.

Next, at S502, the laser system controller 20 may determine whether data on the pulse waveforms of k pulses has been loaded. If the data on the pulse waveforms of k pulses has not been loaded (S502: NO), the laser system controller 20 may standby until the data is loaded. If the data on the pulse waveforms of k pulses has been loaded (S502: YES), the laser system controller 20 may proceed to S503. Here, k may be a constant value determined for calculating an average pulse waveform of the Nth pulse laser beam.

At S503, the laser system controller 20 may calculate an average pulse waveform of the Nth pulse laser beam based on the pulse waveforms of the k pulses. For example, average light intensities may be calculated for corresponding timings to calculate the average pulse waveform. One of the corresponding timings may be, for example, a start timing of each pulse or a peak timing of each pulse.

Next, at S504, the laser system controller 20 may calculate an integrated value of the average pulse waveform to calculate the pulse energy Em(n) of the Nth pulse laser beam.

Next, at S505, the laser system controller 20 may calculate difference $\Delta Em(n)$ between the calculated pulse energy Em(n) and the target value Et(n) of the pulse energy as follows.

$$\Delta Em(n)=Em(n)-Et(n)$$

Next, at S506, the laser system controller 20 may calculate pulse timing T(n) of the average pulse waveform. For example, the pulse timing T(n) may be an average value of two timings where the light intensities are half maximum of the average pulse waveform.

Next, at S507, the laser system controller 20 may determine whether the value of N is 2 or more. If the value of N is 2 or more (S507: YES), the laser system controller 20 may proceed to S508 to S510. If the value of N is 1 (S507: NO), the laser system controller 20 may skip S508 to S510 to proceed to S511.

At S508, the laser system controller 20 may calculate difference $\Delta T(n)$ between the timing T(1) of the first pulse laser beam 21a and the timing T(n) of the Nth pulse laser beam 21n as follows.

$$\Delta T(n)=T(n)-T(1)$$

Next to S508, at S509, the laser system controller 20 may calculate correction amount $\Delta\Delta T(n)$ of the Nth delay time TRd(n) of the Nth pulse laser beam 21n as follows.

$$\Delta\Delta T(n)=TRd(n)-TRd(1)-\Delta T(n)$$

Next to S509, at S510, the laser system controller 20 may update the Nth delay time TRd(n) of the Nth pulse laser beam 21n as follows.

$$TRd(n)=TRd(n)+\Delta\Delta T(n)$$

After S510, the laser system controller 20 may proceed to S511.

At S511, the laser system controller 20 may update the target pulse energy Et(n) as follows.

$$Et(n)=Et(n)+\Delta Em(n)$$

After S511, the laser system controller 20 may terminate the processing of this flowchart to proceed to S106 of FIG. 19.

Figure 21:
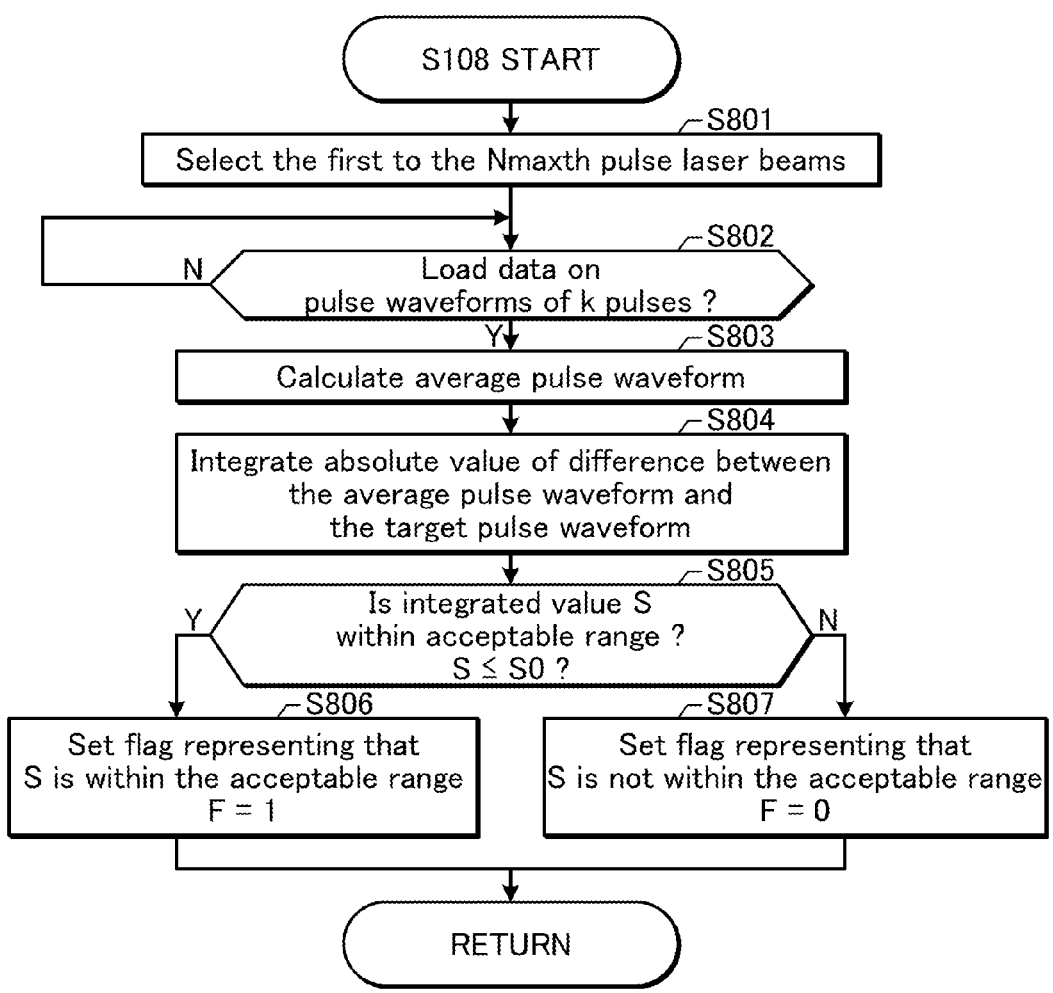
FIG. 21 is a flowchart illustrating a detailed process of measuring a pulse waveform of a bundled laser beam of the first to Nmaxth pulse laser beams shown in FIG. 19.

FIG. 21 is a flowchart illustrating a detailed process of measuring the pulse waveform of the bundled laser beam of the first to Nmaxth pulse laser beams shown in FIG. 19. The processing shown in FIG. 21 may be performed by the laser system controller 20 as a subroutine of S108 shown in FIG. 19

First, at S801, the laser system controller 20 may control the pulse waveform measuring device 6 so as to select the all of the first to Nmaxth pulse laser beams. This may allow the pulse waveform measuring device 6 to start measuring the pulse waveform of the bundled laser beam of the first to Nmaxth pulse laser beams.

Next, at S802, the laser system controller 20 may determine whether data on the pulse waveforms of k pulses has been loaded. If the data on the pulse waveforms of k pulses has not been loaded (S802: NO), the laser system controller 20 may standby until the data is loaded. If the data on the pulse waveforms of k pulses has been loaded (S802: YES), the laser system controller 20 may proceed to S803. Here, k may be a constant value determined for calculating an average pulse waveform of the bundled laser beam of the first to Nmaxth pulse laser beams, and it may be or not be substantially the same as that in S502.

At S803, the laser system controller 20 may calculate an average pulse waveform based on the pulse waveforms of the k pulses. For example, average light intensities may be calculated for corresponding timings to calculate the average pulse waveform. One of the corresponding timings may be, for example, a start timing of each pulse or a peak timing of each pulse.

Next, at S804, the laser system controller 20 may calculate an integrated value of absolute values of differences between the average pulse waveform and the target pulse waveform. For example, the absolute values of the differences may be calculated for corresponding timings, and a cumulative value of the absolute values may be calculated as the integrated value S.

Next, at S805, the laser system controller 20 may determine whether the integrated value S is within an acceptable range by the following formula.

$$S \leq S0$$

S0 may be a threshold value for the acceptable range. If the integrated value S is equal to or less than the threshold value S0, it may be determined that S is within the acceptable range. If S is within the acceptable range (S805: YES), the laser system controller 20 may proceed to S806. If the integrated value S is more than the threshold value S0, it may be determined that S is not within the acceptable range. If S is not within the acceptable range (S805: NO), the laser system controller 20 may proceed to S807.

At S806, the laser system controller 20 may set a flag F to 1 representing that S is within the acceptable range.

At S807, the laser system controller 20 may set the flag F to 0 representing that S is not within the acceptable range.

After S806 or S807, the laser system controller 20 may terminate the processing of this flowchart to proceed to S109 of FIG. 19. The value of the flag may be used for the determination in S109 of FIG. 19.

As described above, the laser system controller 20 may correct, based on the pulse energy and the passage timing of each of the first to Nmaxth pulse laser beams, the target pulse energy Et(n) and the Nth delay time TRd(n) of the individual pulse laser beam. The laser system controller 20 may correct, based on the pulse waveform of the bundled laser beam of the first to Nmaxth pulse laser beams, the target pulse energy Et(n) and the Nth delay time TRd(n) of the individual pulse laser beam. This may allow fine control of the pulse waveform of the bundled laser beam.

In the fifth embodiment, the pulse waveform measuring device 6 may include the beam selecting mechanism 67. However, the present disclosure may not be limited to this. For example, measurement of the Nth pulse laser beam 21n does not require laser oscillation of the laser apparatuses other than the Nth laser apparatus 2n.

6. Others

6.1 Optical Path Length Adjuster

Figure 22:
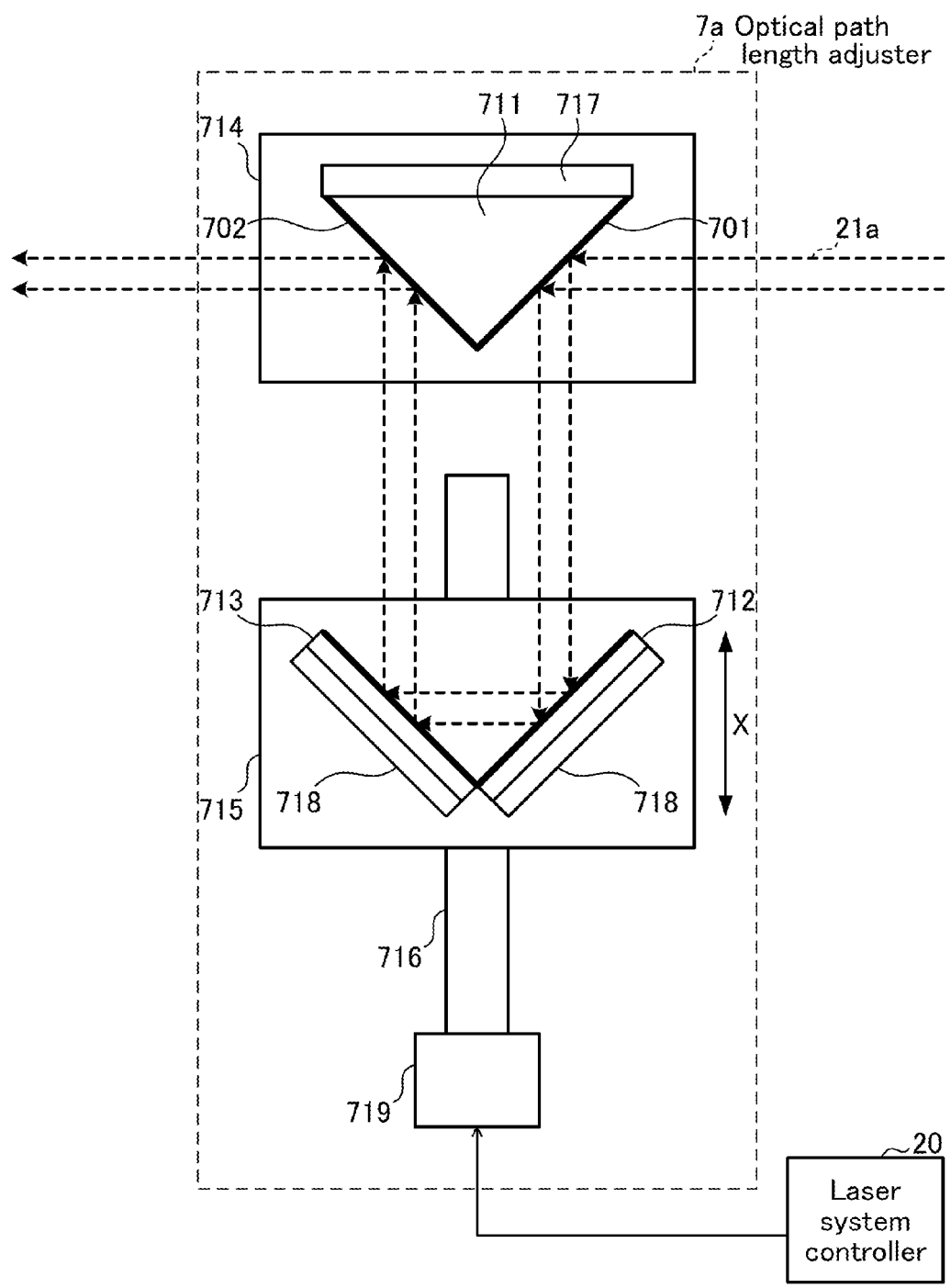
FIG. 22 schematically shows a configuration of an optical path length adjuster shown in FIGS. 1 and 17.

FIG. 22 schematically shows a configuration of the optical path length adjuster shown in FIGS. 1 and 17. For example, the first optical path length adjuster 7a may make the first pulse laser beam 21a detour to change the optical path length of the first pulse laser beam 21a.

Each of the second to fifth optical path length adjusters 7b to 7e may be substantially the same as the first optical path length adjuster 7a. The first to fifth optical path length adjusters 7a to 7e may change the optical path lengths, from the respective laser apparatuses to the emitting position of the laser system 5, to substantially the same value.

The first optical path length adjuster 7a may include a right-angle prism 711, two high-reflective mirrors 712 and 713, plates 714 and 715, and a uniaxial stage 716.

The right-angle prism 711 may have a first surface 701 and a second surface 702 perpendicular to each other, each of which may be coated with a high-reflective film. The right-angle prism 711 may be held by a holder 717. The holder 717 may be fixed to the plate 714. The right-angle prism 711 may be provided in the optical path of the first pulse laser beam 21a.

The two high-reflective mirrors 712 and 713 may be held by a holder 718 such that their reflective surfaces are perpendicular to each other. The holder 718 may be fixed to the plate 715. The plate 715 may be fixed to the uniaxial stage 716. The uniaxial stage 716 may be configured to move the two high-reflective mirrors 712 and 713 in a direction substantially parallel to the optical path axis of the first pulse laser beam 21a reflected by the first surface 701 of the right-angle prism 711.

The first pulse laser beam 21a reflected by the first surface 701 of the right-angle prism 711 may be reflected by the two high-reflective mirrors 712 and 713. The first pulse laser beam 21a is then made incident on the second surface 702 of the right-angle prism 711. The first pulse laser beam 21a incident on the second surface 702 of the right-angle prism 711 may emit from the second surface 702 of the right-angle prism 711 along an extension line of the optical path axis of the first pulse laser beam 21a incident on the first surface 701 of the right-angle prism 711.

The laser system controller 20 may drive a motor 719 of the uniaxial stage 716 to move the two high-reflective mirrors 712 and 713. Moving the two high-reflective mirrors 712 and 713 by a distance X may cause the optical path length of the first pulse laser beam 21a to be changed by 2X.

6.2 Beam Bundling Device Using Flat Mirrors

Figure 23:
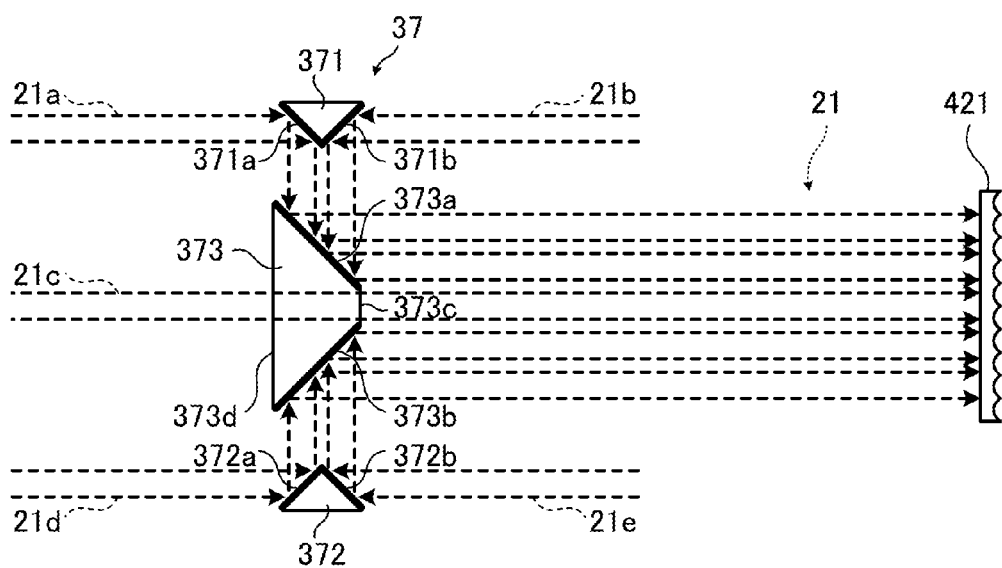
FIG. 23 shows another example of the beam bundling device.

FIG. 23 shows another example of the beam bundling device. FIG. 23 also shows the fly eye lens 421 in the exposure apparatus 4; however, illustration of the high-reflective mirror 41 in the exposure apparatus 4 is omitted. A beam bundling device 37 may include a first right-angle prism 371, a second right-angle prism 372, and a trapezoidal prism 373.

The first right-angle prism 371 may have a triangular prism shape whose base surface parallel to the paper surface has a right-angled triangular shape. The first right-angle prism 371 may have two side-surfaces perpendicular to each other, each of which may be coated with a high-reflective film. The respective two side-surfaces of the first right-angle prism 371 may constitute a first reflective surface 371a and a second reflective surface 371b.

The first right-angle prism 371 may be arranged such that the first reflective surface 371a of the first right-angle prism 371 is parallel to a below-mentioned first reflective surface 373a of the trapezoidal prism 373. The first right-angle prism 371 may be arranged such that the first reflective surface 371a of the first right-angle prism 371 intersects the optical path axis of the first pulse laser beam 21a at an angle of 45 degrees. The first right-angle prism 371 may be arranged such that the second reflective surface 371b of the first right-angle prism 371 intersects the optical path axis of the second pulse laser beam 21b at an angle of 45 degrees.

The second right-angle prism 372 may have a triangular prism shape whose base surface parallel to the paper surface has a right-angled triangular shape. The second right-angle prism 372 may have two side-surfaces perpendicular to each other, each of which may be coated with a high-reflective film. The respective two side-surfaces of the second right-angle prism 372 may constitute a first reflective surface 372a and a second reflective surface 372b.

The second right-angle prism 372 may be arranged such that the first reflective surface 372a of the second right-angle prism 372 is substantially parallel to a below-mentioned second reflective surface 373b of the trapezoidal prism 373. The second right-angle prism 372 may be arranged such that the first reflective surface 372a of the second right-angle prism 372 intersects the optical path axis of the fourth pulse laser beam 21d at an angle of 45 degrees. The second right-angle prism 372 may be arranged such that the second reflective surface 372b of the second right-angle prism 372 intersects the optical path axis of the fifth pulse laser beam 21e at an angle of 45 degrees.

The trapezoidal prism 373 may be made by an ultraviolet-transmitting material, such as synthetic quartz or calcium fluoride. The trapezoidal prism 373 may have a quadrangular prism shape whose base surface parallel to the paper surface has a quadrangular shape. The base surface of the trapezoidal prism 373 has a shape of isosceles trapezoid whose non-parallel and opposite sides are perpendicular to each other.

The trapezoidal prism 373 may have two opposite side-surfaces which are non-parallel to each other, each of which may be coated with a high-reflective film. The respective two opposite side-surfaces which are non-parallel to each other may constitute the first reflective surface 373a and the second reflective surface 373b.

The trapezoidal prism 373 may have the other two opposite side-surfaces which are parallel to each other, each of which may be coated with an anti-reflective film. The respective two opposite side-surfaces which are parallel to each other may constitute a first transmitting surface 373c and a second transmitting surface 373d.

The trapezoidal prism 373 may be arranged such that the second transmitting surface 373d of the trapezoidal prism 373 is perpendicular to the optical path axis of the third pulse laser beam 21c.

The first pulse laser beam 21a emitted from the first laser apparatus 2a may be reflected by the first reflective surface 371a of the first right-angle prism 371. The first pulse laser beam 21a may be reflected by the first reflective surface 373a of the trapezoidal prism 373 and then enter the surface of the fly eye lens 421 at a right angle.

The second pulse laser beam 21b emitted from the second laser apparatus 2b may be reflected by the second reflective surface 371b of the first right-angle prism 371. The second pulse laser beam 21b may be reflected by the first reflective surface 373a of the trapezoidal prism 373 and then enter the surface of the fly eye lens 421 at a right angle.

The third pulse laser beam 21c emitted from the third laser apparatus 2c may enter the second transmitting surface 373d of the trapezoidal prism 373 to travel inside the prism. The third pulse laser beam 21c incident on the trapezoidal prism 373 may emit from the first transmitting surface 373c and then enter the surface of the fly eye lens 421 at a right angle.

The fourth pulse laser beam 21d emitted from the fourth laser apparatus 2d may be reflected by the first reflective surface 372a of the second right-angle prism 372. The fourth pulse laser beam 21d may be reflected by the second reflective surface 373b of the trapezoidal prism 373 and then enter the surface of the fly eye lens 421 at a right angle.

The fifth pulse laser beam 21e emitted from the fifth laser apparatus 2e may be reflected by the second reflective surface 372b of the second right-angle prism 372. The fifth pulse laser beam 21e may be reflected by the second reflective surface 373b of the trapezoidal prism 373 and then enter the surface of the fly eye lens 421 at a right angle.

The beam bundling device 37 may thus align the first to fifth pulse laser beams 21a to 21e, such that the optical path axes of them are substantially parallel to each other, to emit them as the bundled laser beam 21. The bundled laser beam 21 emitted from the beam bundling device 37 may enter the fly eye lens 421. Thus, the beam bundling device 37 does not need to make the first to fifth pulse laser beams 21a to 21e overlap with each other.

If the beam bundling device 37 is used, the pulse waveform measuring device 6 including the beam selecting mechanism 67 described in reference to FIG. 18 may be provided in the optical path of the bundled laser beam 21 emitted from the beam bundling device 37.

6.3 Configuration of Controller

Figure 24:
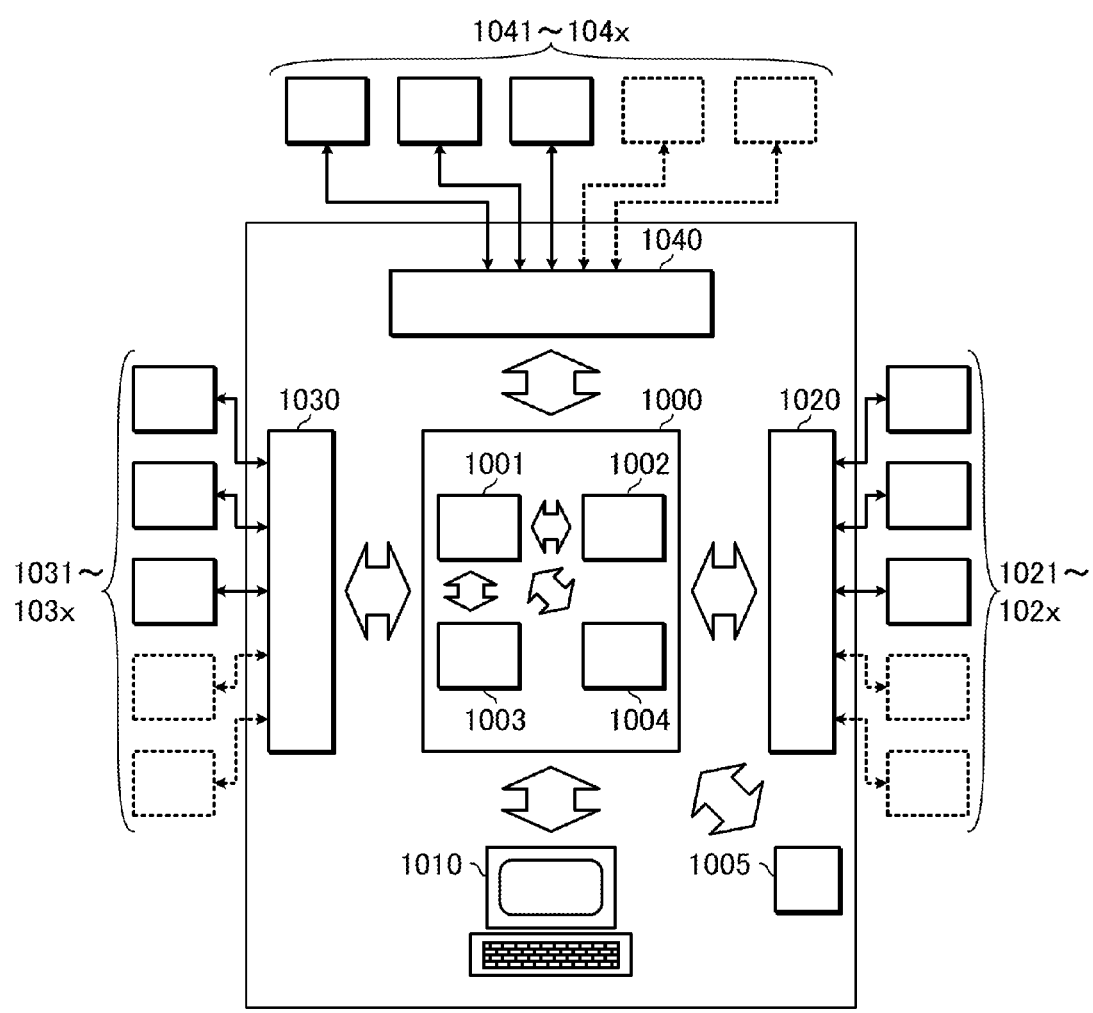
FIG. 24 is a block diagram schematically illustrating a configuration of a controller.

FIG. 24 is a block diagram schematically illustrating a configuration of a controller.

A controller, such as the laser system controller 20 or the synchronous controller 22, in the above-mentioned embodiments may be constituted by a general-purpose control device, such as a computer or a programmable controller. For example, the controller may be constituted as described below.

(Configuration)

The controller may include a processor 1000 and other elements connected to the processor 1000. Such elements may include a storage memory 1005, a user interface 1010, a parallel input/output (I/O) controller 1020, a serial I/O controller 1030, and an analog-to-digital (A/D) and digital-to-analog (D/A) converter 1040. The processor 1000 may include a central processing unit (CPU) 1001 and other elements connected to the CPU 1001 including a memory 1002, a timer 1003, and a graphics processing unit (GPU) 1004.

(Operation)

The processor 1000 may read out programs stored in the storage memory 1005. The processor 1000 may execute the read-out programs, read out data from the storage memory 1005 in accordance with the execution of the programs, or store data in the storage memory 1005.

The parallel I/O controller 1020 may be connected to devices 1021 to 102x communicable through parallel I/O ports. The parallel I/O controller 1020 may control communication using digital signals through the parallel I/O ports that is performed in the process where the processor 1000 executes programs.

The serial I/O controller 1030 may be connected to devices 1031 to 103x communicable through serial I/O ports. The serial I/O controller 1030 may control communication using digital signals through the serial I/O ports that is performed in the process where the processor 1000 executes programs.

The A/D and D/A converter 1040 may be connected to devices 1041 to 104x communicable through analog ports. The A/D and D/A converter 1040 may control communication using analog signals through the analog ports that is performed in the process where the processor 1000 executes programs.

The user interface 1010 may be configured to display progress of executing programs by the processor 1000 to an operator or to receive instructions by the operator to the processor 1000 to stop execution of the programs or to execute interruption processing.

The CPU 1001 of the processor 1000 may perform arithmetic processing of programs. In the process where the CPU 1001 executes programs, the memory 1002 may temporally store programs or temporally store data in the arithmetic process. The timer 1003 may measure time or elapsed time. The timer 1003 may output the time or the elapsed time to the CPU 1001 in accordance with the execution of the programs. When image data is inputted to the processor 1000, the GPU 1004 may process the image data in accordance with the execution of the programs and output the results to the CPU 1001.

The devices 1021 to 102x communicable through the parallel I/O ports, which are connected to the parallel I/O controller 1020, may be the first to fifth laser apparatuses 2a to 2e, the exposure apparatus controller 40, another controller, or the like, and may be used for sending or receiving the oscillation trigger signal or the signal indicating the timing.

The devices 1031 to 103x communicable through the serial I/O ports, which are connected to the serial I/O controller 1030, may be the first to fifth laser apparatuses 2a to 2e, the exposure apparatus controller 40, another controller, or the like, and may be used for sending or receiving data.

The devices 1041 to 104x communicable through the analog ports, which are connected to the A/D and D/A converter 1040, may be various sensors, such as the pulse waveform measuring device 6, the pulse energy measuring unit 17, or the like.

With the above-mentioned configuration, the controller may be capable of achieving the operation illustrated in each of the embodiments.

The aforementioned descriptions are intended to be taken only as examples, and are not to be seen as limiting in any way. Accordingly, it will be clear to those skilled in the art that variations on the embodiments of the present disclosure may be made without departing from the scope of the appended claims.

The terms used in the present specification and in the entirety of the scope of the appended claims are to be interpreted as not being limiting. For example, wording such as "includes" or "is included" should be interpreted as not being limited to the item that is described as being included. Furthermore, "has" should be interpreted as not being limited to the item that is described as being had. Furthermore, the modifier "a" or "an" as used in the present specification and the scope of the appended claims should be interpreted as meaning "at least one" or "one or more".

The invention claimed is:

1. A laser system comprising:
    a delay circuit unit configured to receive a trigger signal, output a first delay signal representing that a first delay time has passed since the delay circuit unit received the trigger signal, and output a second delay signal representing that a second delay time has passed since the delay circuit unit received the trigger signal;
    a first trigger-correction unit configured to receive the first delay signal and output a first switch signal representing that a first correction time has passed since the first trigger-correction unit received the first delay signal;
    a second trigger-correction unit configured to receive the second delay signal and output a second switch signal representing that a second correction time has passed since the second trigger-correction unit received the second delay signal;
    a first laser apparatus including
        a first capacitor,
        a first charger configured to apply voltage to the first capacitor,
        a first switch configured to receive the first switch signal and allow the first capacitor to output a pulse current,
        a first magnetic compression circuit configured to compress the pulse current outputted from the first capacitor,
        a first chamber containing laser gas,
        a first pair of discharge electrodes provided in the first chamber and connected to the first magnetic compression circuit, and
        a first discharge timing detector configured to detect discharge between the first pair of discharge electrodes and output a first discharge detection signal;
    a second laser apparatus including
        a second capacitor,
        a second charger configured to apply voltage to the second capacitor,
        a second switch configured to receive the second switch signal and allow the second capacitor to output a pulse current,
        a second magnetic compression circuit configured to compress the pulse current outputted from the second capacitor,
        a second chamber containing laser gas,
        a second pair of discharge electrodes provided in the second chamber and connected to the second magnetic compression circuit, and
        a second discharge timing detector configured to detect discharge between the second pair of discharge electrodes and output a second discharge detection signal; and
    a clock generator configured to generate a clock signal that is common to the delay circuit unit, the first trigger-correction unit and the second trigger-correction unit, wherein
    the first trigger-correction unit receives the first discharge detection signal and sets the first correction time so that a first elapsed time between a timing of receiving the first delay signal and a timing of receiving the first discharge detection signal approaches a first target value, and
    the second trigger-correction unit receives the second discharge detection signal and sets the second correction time so that a second elapsed time between a timing of receiving the second delay signal and a timing of receiving the second discharge detection signal approaches a second target value.

2. The laser system according to claim 1, wherein the first trigger-correction unit is configured to further perform
    receiving a setting value of voltage to be applied to the first capacitor by the first charger,
    a first setting to set the first correction time based on the setting value of the voltage, and
    a second setting to set the first correction time based on the first elapsed time.

3. The laser system according to claim 2, wherein the first trigger-correction unit is configured to perform
    the first setting at a first frequency, and
    the second setting at a second frequency lower than the first frequency.

4. The laser system according to claim 1, wherein
    the first laser apparatus includes
        a first oscillator configured to receive the first switch signal and generate a first pulse laser beam, and a first power amplifier configured to amplify the first pulse laser beam, and the second laser apparatus includes
- a second oscillator configured to receive the second switch signal and generate a second pulse laser beam, and
- a second power amplifier configured to amplify the second pulse laser beam.

5. The laser system according to claim 4, wherein
the first trigger-correction unit is configured to further output a first amplifier switch signal representing that a first set amount of time has passed since the first trigger-correction unit received the first delay signal,
the first oscillator includes the first capacitor, the first charger, the first switch, the first magnetic compression circuit, the first chamber, the first pair of discharge electrodes, and the first discharge timing detector,
the first power amplifier includes
- a third capacitor,
- a third charger configured to apply voltage to the third capacitor,
- a third switch configured to receive the first amplifier switch signal and allow the third capacitor to output a pulse current,
- a third magnetic compression circuit configured to compress the pulse current outputted from the third capacitor,
- a third chamber containing laser gas,
- a third pair of discharge electrodes provided in the third chamber and connected to the third magnetic compression circuit, and
- a third discharge timing detector configured to detect discharge between the third pair of discharge electrodes and output a first amplifier discharge detection signal, and the first trigger-correction unit is configured to further receive the first discharge detection signal and the first amplifier discharge detection signal and set the first set amount of time so that time lag from a timing of receiving the first discharge detection signal until a timing of receiving the first amplifier discharge detection signal approaches a third target value.

6. The laser system according to claim 1, further comprising:
- a beam bundling device configured to bundle the pulse laser beam emitted from the first laser apparatus and the pulse laser beam emitted from the second laser apparatus and to emit a bundled laser beam; and
- a pulse waveform measuring device configured to measure a pulse waveform of the bundled laser beam.

7. The laser system according to claim 6, wherein the delay circuit unit is configured to set the first delay time and the second delay time based on the pulse waveform measured by the pulse waveform measuring device.

8. The laser system according to claim 7, further comprising
an optical path length adjuster configured to adjust a first optical path length from the light-emitting position of the first laser apparatus to the light-emitting position of the beam bundling device and adjust a second optical path length from the light-emitting position of the second laser apparatus to the light-emitting position of the beam bundling device, so as to reduce difference between the first optical path length and the second optical path length, wherein
the first target value and the second target value are substantially the same with each other.

9. A laser system comprising:
a first laser apparatus including
- a first delay circuit unit configured to receive a trigger signal and output a first delay signal representing that a first delay time has passed since the first delay circuit unit received the trigger signal,
- a first trigger-correction unit configured to receive the first delay signal and output a first switch signal representing that a first correction time has passed since the first trigger-correction unit received the first delay signal,
- a first clock generator configured to generate a clock signal that is common to the first delay circuit unit and the first trigger-correction unit,
- a first capacitor,
- a first charger configured to apply voltage to the first capacitor,
- a first switch configured to receive the first switch signal and allow the first capacitor to output a pulse current,
- a first magnetic compression circuit configured to compress the pulse current outputted from the first capacitor,
- a first chamber containing laser gas,
- a first pair of discharge electrodes provided in the first chamber and connected to the first magnetic compression circuit, and
- a first discharge timing detector configured to detect discharge between the first pair of discharge electrodes and output a first discharge detection signal; and a second laser apparatus including
- a second delay circuit unit configured to receive the trigger signal and output a second delay signal representing that a second delay time has passed since the second delay circuit unit received the trigger signal,
- a second trigger-correction unit configured to receive the second delay signal and output a second switch signal representing that a second correction time has passed since the second trigger-correction unit received the second delay signal,
- a second clock generator configured to generate a clock signal that is common to the second delay circuit unit and the second trigger-correction unit,
- a second capacitor,
- a second charger configured to apply voltage to the second capacitor,
- a second switch configured to receive the second switch signal and allow the second capacitor to output a pulse current,
- a second magnetic compression circuit configured to compress the pulse current outputted from the second capacitor,
- a second chamber containing laser gas,
- a second pair of discharge electrodes provided in the second chamber and connected to the second magnetic compression circuit, and
- a second discharge timing detector configured to detect discharge between the second pair of discharge electrodes and output a second discharge detection signal, wherein the first trigger-correction unit receives the first discharge detection signal and sets the first correction time so that a first elapsed time between a timing of receiving the first delay signal and a timing of receiving the first discharge detection signal approaches a first target value, and the second trigger-correction unit receives the second discharge detection signal and sets the second correction time so that a second elapsed time between a timing of receiving the second delay signal and a timing of receiving the second discharge detection signal approaches a second target value.

* * * * *